(12) United States Patent
Tamaso

(10) Patent No.: US 8,716,129 B2
(45) Date of Patent: May 6, 2014

(54) METHOD FOR MANUFACTURING SILICON CARBIDE SEMICONDUCTOR DEVICE

(71) Applicant: Sumitomo Electric Industries, Ltd., Osaka (JP)

(72) Inventor: Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/937,893

(22) Filed: Jul. 9, 2013

(65) Prior Publication Data

US 2014/0045322 A1 Feb. 13, 2014

Related U.S. Application Data

(60) Provisional application No. 61/682,481, filed on Aug. 13, 2012.

(30) Foreign Application Priority Data

Aug. 13, 2012 (JP) ................................. 2012-179255

(51) Int. Cl.
*H01L 21/44* (2006.01)

(52) U.S. Cl.
USPC ............................. 438/660; 438/652; 438/658

(58) Field of Classification Search
USPC .......... 438/652, 655, 656, 658, 660, 661, 688
See application file for complete search history.

(56) References Cited

U.S. PATENT DOCUMENTS

| 8,415,241 | B2* | 4/2013 | Yamada | 438/586 |
| 2010/0055858 | A1* | 3/2010 | Hayashi et al. | 438/285 |
| 2011/0031506 | A1 | 2/2011 | Tamaso | |
| 2011/0031507 | A1* | 2/2011 | Tamaso | 257/77 |
| 2012/0129343 | A1* | 5/2012 | Tamaso et al. | 438/685 |
| 2012/0184094 | A1* | 7/2012 | Yamada | 438/586 |
| 2013/0292703 | A1* | 11/2013 | Horii et al. | 257/77 |

FOREIGN PATENT DOCUMENTS

| JP | H10-512716 A | 12/1998 |
| JP | 2002-075909 A | 3/2002 |
| JP | 2008-078434 A | 4/2008 |
| JP | 2008-078435 A | 4/2008 |

(Continued)

OTHER PUBLICATIONS

U.S. Appl. No. 13/937,837, filed Jul. 9, 2013.

(Continued)

*Primary Examiner* — Kevin M Picardat

(74) *Attorney, Agent, or Firm* — Venable LLP; Michael A. Sartori

(57) ABSTRACT

A method for manufacturing a silicon carbide semiconductor device includes the step of forming a silicon dioxide film. The step of forming an electrode includes the steps of forming a metal film containing Al and Ti on the silicon carbide substrate, and heating the metal film. The step of heating the metal film has the steps of increasing temperature of the metal film from a temperature of less than 300° C. to a temperature of not less than 300° C. and not more than 450° C. with a first temperature gradient, holding the metal film within a temperature range of not less than 300° C. and not more than 450° C. with a second temperature gradient, and increasing the temperature of the metal film to a temperature of not less than 500° C. with a third temperature gradient. The second temperature gradient is smaller than the first temperature gradient and the third temperature gradient.

5 Claims, 18 Drawing Sheets

(56) References Cited

FOREIGN PATENT DOCUMENTS

| | | |
|---|---|---|
| JP | 2011-082254 A | 4/2011 |
| JP | 2012-146838 A | 8/2012 |
| WO | WO-96/22611 A1 | 7/1996 |
| WO | WO-2008/035822 A1 | 3/2008 |
| WO | WO-2009/128419 A1 | 10/2009 |

OTHER PUBLICATIONS

International Search Report and Written Opinion in PCT International Application No. PCT/JP2013/068094, dated Oct. 8, 2013.
International Search Report and Written Opinion in PCT International Application No. PCT/JP2013/068096, dated Oct. 8, 2013.

\* cited by examiner

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device, and more particularly to a method for manufacturing a silicon carbide semiconductor device having the step of forming a silicon dioxide film on a silicon carbide substrate.

2. Description of the Background Art

In recent years, silicon carbide substrates have come into use to manufacture semiconductor devices. Silicon carbide has a band gap larger than that of silicon. Accordingly, a semiconductor device using a silicon carbide substrate has advantages such as high breakdown voltage, low ON resistance, and less deterioration of characteristics under a high temperature environment.

International Publication No. 2009/128419 discloses an ohmic contact electrode which is arranged in contact with a SiC wafer (silicon carbide substrate) and contains titanium (Ti) and aluminum (Al) as materials. According to the publication, contact resistance to the SiC substrate can be reduced by using the above materials.

However, when an electrode containing Ti and Al is adopted, there have been cases where insulation reliability of an insulating film may be decreased.

SUMMARY OF THE INVENTION

Thus, one object of the present invention is to provide a method for manufacturing a silicon carbide semiconductor device capable of improving insulation reliability of an insulating film when an electrode containing Ti and Al is used.

The inventor of the present invention conducted earnest studies on the cause of a decrease in insulation reliability of an insulating film due to diffusion of Al atoms of a contact electrode into the insulating film, and, as a result, obtained the following finding. Specifically, when a metal film containing Ti and Al is formed and subjected to annealing at about 1000° C. to establish ohmic contact with a silicon carbide substrate, a silicon dioxide film in contact with the metal film reacts with Al and thus deteriorates insulation properties of the silicon dioxide film. Al reacts with the silicon dioxide film at a temperature of about 500° C. Further, reaction between Si and Ti and reaction between Si and Al are started at a temperature of about 300° C., and Ti and Al are silicidized. It is noted that silicidized Al hardly reacts with the silicon dioxide film even when the temperature reaches 500° C.

As a method for annealing a metal film, an RTA (Rapid Thermal Anneal) method can be used, in which temperature of the metal film is increased from room temperature to about 1000° C. in a few minutes. When annealing is performed on a metal film using the RTA method, Al contained in the metal film passes through temperatures ranging from 300° C. to 500° C. in a short time. Therefore, even when the temperature of the metal film reaches 500° C., there remains unsilicidized Al. The unsilicidized Al starts reacting with the silicon dioxide film at 500° C. As a result, Al penetrates into the silicon dioxide film, and thus insulation properties of the silicon dioxide film is deteriorated.

A method for manufacturing a silicon carbide semiconductor device in accordance with the present invention includes the steps of preparing a silicon carbide substrate, forming a silicon dioxide film on the silicon carbide substrate, and forming an electrode containing Al and Ti to make contact with the silicon carbide substrate and the silicon dioxide film. The step of forming the electrode includes the steps of forming a metal film containing Al and Ti on the silicon carbide substrate, and heating the metal film. The step of heating the metal film has the steps of increasing temperature of the metal film from a temperature of less than 300° C. to a temperature of not less than 300° C. and not more than 450° C. with a first temperature gradient, holding the metal film within a temperature range of not less than 300° C. and not more than 450° C. with a second temperature gradient after the step of increasing the temperature of the metal film, and increasing the temperature of the metal film to a temperature of not less than 500° C. with a third temperature gradient after the step of holding the metal film. The second temperature gradient is smaller than the first temperature gradient and the third temperature gradient.

According to the method for manufacturing the silicon carbide semiconductor device in accordance with the present invention, the metal film containing Al is held in a state having a small temperature gradient within the temperature range of not less than 300° C. and not more than 450° C. That is, a heat treatment pattern is set such that the metal film containing Al slowly passes through a temperature range in which alloying proceeds and penetration of Al is suppressed. Thereby, Al is sufficiently silicidized, and thus unreacted Al (i.e., unsilicidized Al) is reduced. Accordingly, Al can be suppressed from reacting with the silicon dioxide film even when the temperature of the metal film is thereafter increased to not less than 500° C. As a result, insulation reliability of the silicon dioxide film can be improved.

Preferably, in the method for manufacturing the silicon carbide semiconductor device, the metal film further contains Si. Thereby, an electrode having a low contact resistance to both n type silicon carbide and p type silicon carbide can be manufactured.

Preferably, in the method for manufacturing the silicon carbide semiconductor device, in the step of increasing the temperature of the metal film to a temperature of not less than 500° C., the temperature of the metal film is increased to a temperature of not less than 700° C. Thereby, the metal film can react with silicon carbide constituting the silicon carbide substrate and form an ohmic electrode.

Preferably, in the method for manufacturing the silicon carbide semiconductor device, the step of forming the metal film has the steps of forming a Ti layer to make contact with the silicon carbide substrate and the silicon dioxide film, forming an Al layer on the Ti layer, and forming a Si layer on the Al layer. Thereby, a lower contact resistance to both n type silicon carbide and p type silicon carbide can be achieved.

Preferably, in the method for manufacturing the silicon carbide semiconductor device, the step of heating the metal film further has the step of removing Al by performing wet etching on the metal film. The step of removing Al is performed after the step of holding the metal film within the temperature range of not less than 300° C. and not more than 450° C. and before the step of increasing the temperature of the metal film to a temperature of not less than 500° C. Thereby, Al can be effectively removed, and thus Al can be effectively suppressed from reacting with silicon dioxide.

As is clear from the above description, according to the present invention, insulation reliability of an insulating film in a silicon carbide semiconductor device having an electrode containing Ti and Al can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
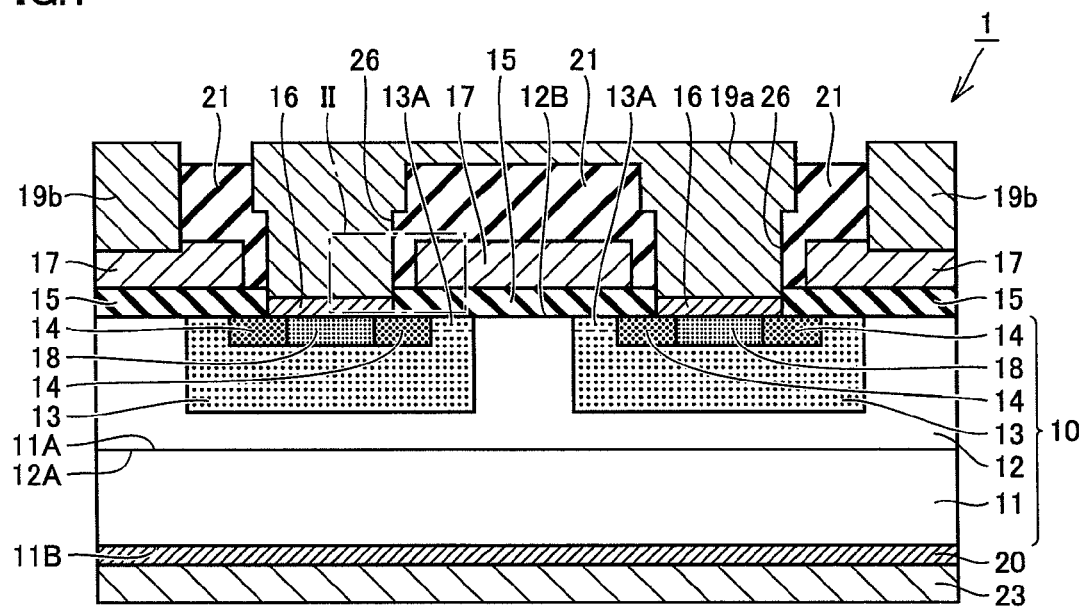
FIG. 1 is a schematic cross sectional view showing a configuration of a MOSFET (Metal Oxide Semiconductor Field Effect Transistor) in accordance with Embodiment 1 of the present invention.

Hereinafter, embodiments of the present invention will be described with reference to the drawings, in which identical or corresponding parts will be designated by the same reference numerals, and the description thereof will not be repeated.

Embodiment 1

First, a configuration of a MOSFET (Metal Oxide Semiconductor Field Effect Transistor) as a silicon carbide semiconductor device in accordance with Embodiment 1 of the present invention will be described.

Referring to FIG. 1, a MOSFET 1 has a silicon carbide substrate 10. Silicon carbide substrate 10 has an $n^+$ substrate 11, an $n^-$ SiC layer 12, a p body 13, an $n^+$ source region 14, and a $p^+$ region 18.

$N^+$ substrate 11 is a substrate having n type conductivity which is made of silicon carbide (SiC). $N^+$ substrate 11 contains a high concentration of an n type impurity (i.e., an impurity having n type conductivity), for example, N (nitrogen).

$N^-$ SiC layer 12 is a semiconductor layer having n type conductivity which is made of SiC. $N^-$ SiC layer 12 is formed on one main surface 11A of $n^+$ substrate 11, with a thickness of, for example, about 10 μm. An n type impurity contained in $n^-$ SiC layer 12 is, for example, N (nitrogen), and is contained at a concentration lower than that of the n type impurity contained in $n^+$ substrate 11, for example, at a concentration of $5 \times 10^{15}$ cm$^{-3}$.

A pair of p bodies 13 has p type conductivity. P bodies 13 in a pair are formed to be separated from each other so as to include a second main surface 12B (substrate surface) of n⁻ SiC layer 12 which is a main surface opposite to a first main surface 12A as a main surface on a side facing n⁺ substrate 11. A p type impurity contained in p body 13 is, for example, Al (aluminum), B (boron), or the like, and is contained at a concentration lower than that of the n type impurity contained in n⁺ substrate 11, for example, at a concentration of $1 \times 10^{17}$ cm$^{-3}$.

N⁺ source region 14 has n type conductivity. N⁺ source region 14 is formed in each of the pair of p bodies 13 so as to include second main surface 12B and to be surrounded by p body 13. N⁺ source region 14 contains an n type impurity, for example, P (phosphorus) or the like, at a concentration higher than that of the n type impurity contained in n⁻ SiC layer 12, for example, at a concentration of $1 \times 10^{20}$ cm$^{-3}$.

P⁺ region 18 has p type conductivity. P⁺ region 18 is formed opposite to n⁺ source region 14 formed in one of the pair of p bodies 13, when viewed from n⁺ source region 14 formed in the other of the pair of p bodies 13, so as to include second main surface 12B. P⁺ region 18 contains a p type impurity, for example, Al, B, or the like, at a concentration higher than that of the p type impurity contained in p body 13, for example, at a concentration of $1 \times 10^{20}$ cm$^{-3}$.

Further, MOSFET 1 includes a gate oxide film 15 as a gate insulating film, a gate electrode 17, a pair of source contact electrodes 16, a source wire 19, a drain electrode 20, and an insulating film 21.

Gate oxide film 15 is formed on second main surface 12B of n⁻ SiC layer 12 to make contact with second main surface 12B and to extend from an upper surface of one n⁺ source region 14 to an upper surface of the other n⁺ source region 14. Gate oxide film 15 is made of silicon dioxide.

Gate electrode 17 is arranged in contact with gate oxide film 15 to extend from above one n⁺ source region 14 to above the other n⁺ source region 14. Gate electrode 17 is made of a conductor such as polysilicon, Al, or the like.

Source contact electrode 16 is arranged to extend from above each of a pair of n⁺ source regions 14 to above p⁺ region 18 in directions away from gate oxide film 15, and to make contact with second main surface 12B. Source contact electrode 16 contains, for example, titanium (Ti) atoms, aluminum (Al) atoms, and silicon (Si) atoms. Details of source contact electrode 16 will be described later.

A source wire 19a is formed in contact with source contact electrode 16, and is made of a conductor such as Ti/Al, for example. Source wire 19a is electrically connected with n⁺ source region 14 via source contact electrode 16. Source wire 19a is formed to cover insulating film 21. Further, a gate liner portion 19b is formed to make contact with gate electrode 17.

Drain electrode 20 is formed in contact with the other main surface 11B of n⁺ substrate 11 which is a main surface opposite to one main surface 11A as a main surface on a side where n⁻ SiC layer 12 is formed. Drain electrode 20 may have the same configuration as that of source contact electrode 16, for example, or may be made of another material, such as Ni, which can establish ohmic contact with n⁺ substrate 11. Thereby, drain electrode 20 is electrically connected with n⁺ substrate 11. Further, a back surface pad electrode 23 made of, for example, Ni/Au is formed in contact with drain electrode 20.

Insulating film 21 is formed to make contact with gate oxide film 15 and to cover gate electrode 17. Insulating film 21 is made of, for example, silicon dioxide, and electrically insulates gate electrode 17 from outside. Further, a passivation film (not shown) may be formed on insulating film 21.

As source contact electrode 16, an electrode containing Ti and Al is used. Preferably, as source contact electrode 16, an electrode containing Ti, Al, and Si is used. When source contact electrode 16 is an ohmic contact electrode containing Ti, Al, and Si, it has a sufficiently low contact resistance to any of a p type SiC region and an n type SiC region. Source contact electrode 16 is arranged to extend from a region in contact with n⁺ source region 14 to a region in contact with p⁺ region 18.

Figure 2:
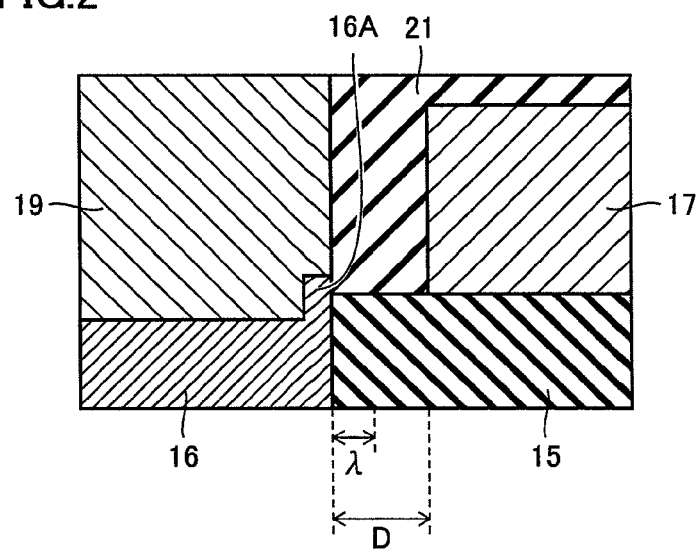
FIG. 2 is an enlarged view of a region II in FIG. 1.

A configuration in the vicinity of source contact electrode 16 and gate oxide film 15 will be described with reference to FIG. 2.

Source contact electrode 16 of MOSFET 1 in the present embodiment is provided on silicon carbide substrate 10, and is in contact with gate oxide film 15 made of silicon dioxide. Source contact electrode 16 may have a region 16A which is in contact with insulating film 21 made of silicon dioxide, as shown in FIG. 2. Source contact electrode 16 contains Ti atoms and Al atoms. Preferably, source contact electrode 16 further contains Si atoms.

Gate electrode 17 is provided in contact with each of gate oxide film 15 and insulating film 21. Gate electrode 17 contains, for example, polysilicon. Gate electrode 17 and source contact electrode 16 are insulated from each other by gate oxide film 15 and insulating film 21. In other words, gate electrode 17 (a first electrode) and source contact electrode 16 (a second electrode) are separated from each other by the silicon dioxide films.

As described above, when a metal film containing Al is subjected to annealing to form an electrode, Al contained in the metal film may diffuse into a silicon dioxide film. In the present embodiment, it is assumed that Al diffuses into gate oxide film 15 located between gate electrode 17 (the first electrode) and source contact electrode 16 (the second electrode). A region λ where Al is present at an atomic ratio of not less than 1% in gate oxide film 15 (silicon dioxide film) in the present embodiment is not more than 50% of a distance D between gate electrode 17 (the first electrode) and source contact electrode 16 (the second electrode). More preferably, region λ where Al is present at an atomic ratio of not less than 1% is not more than 10% of distance D between gate electrode 17 (the first electrode) and source contact electrode 16 (the second electrode). Specifically, region λ where Al is present at an atomic ratio of not less than 1% is not more than 0.5 μm, and preferably not more than 0.1 μm. Al may diffuse into insulating film 21. Also in this case, region λ where Al is present at an atomic ratio of not less than 1% in insulating film 21 (silicon dioxide film) is not more than 50% of distance D between gate electrode 17 (the first electrode) and source contact electrode 16 (the second electrode).

Next, an operation of MOSFET 1 will be described. In a state where a voltage which is not more than a threshold value is applied to gate electrode 17, i.e., in an OFF state, a portion between p body 13 and n⁻ SiC layer 12 located immediately below gate oxide film 15 is reverse-biased, and thus MOSFET 1 is in an non-conductive state. On the other hand, when a positive voltage is applied to gate electrode 17, an inversion layer is formed in a channel region 13A of p body 13 in the vicinity of and in contact with gate oxide film 15. As a result, n⁺ source region 14 and n⁻ SiC layer 12 are electrically connected with each other, and thus a current flows between a source electrode 22 and drain electrode 20.

Next, a method for manufacturing MOSFET 1 in Embodiment 1 will be described.

Figure 3:
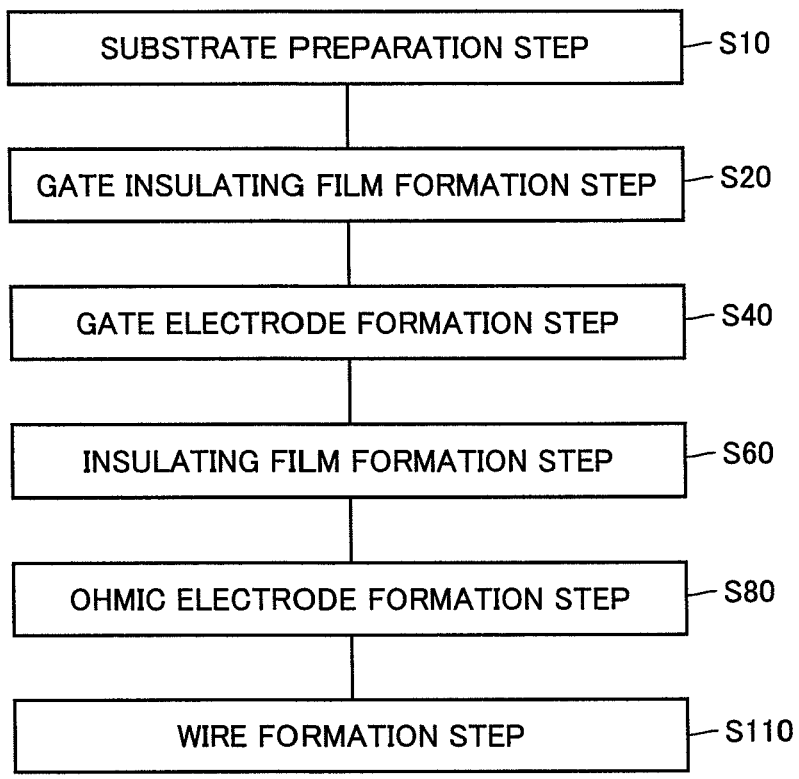
FIG. 3 is a flowchart schematically showing a method for manufacturing the MOSFET in accordance with Embodiment 1 of the present invention.
Figure 5:
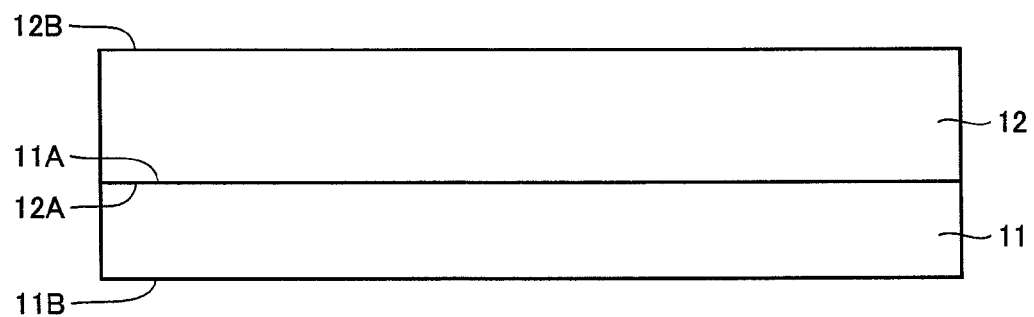
FIG. 5 is a schematic cross sectional view showing a first step of the method for manufacturing the MOSFET in accordance with Embodiment 1 of the present invention.
Figure 6:
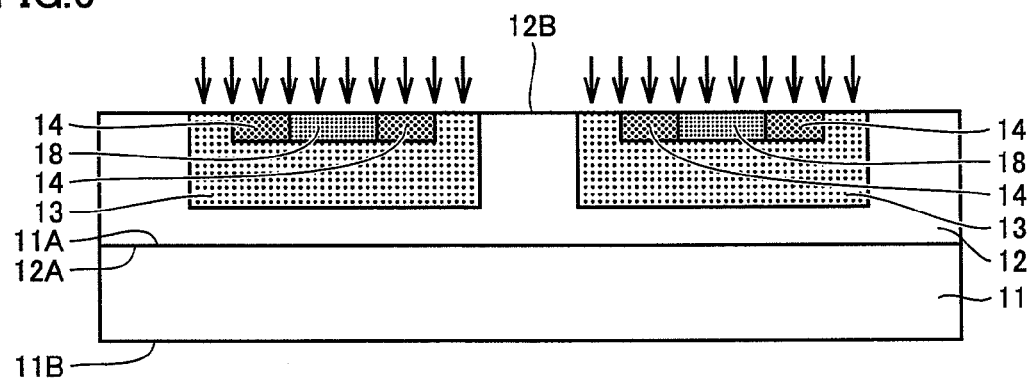
FIG. 6 is a schematic cross sectional view showing a second step of the method for manufacturing the MOSFET in accordance with Embodiment 1 of the present invention.

Referring to FIGS. 5 and 6, first, silicon carbide substrate 10 is prepared by a substrate preparation step S10 (FIG. 3).

Specifically, first, n⁻ SiC layer 12 is formed on one main surface 11A of n⁺ SiC substrate 11 by epitaxial growth on n⁺ SiC substrate 11. The epitaxial growth can be performed by employing a mixed gas of $SiH_4$ (silane) and $C_3H_8$ (propane) as a source gas. On this occasion, as an n type impurity, for example, N (nitrogen) is introduced. Thereby, n⁻ SiC layer 12 containing an n type impurity having a concentration lower than that of the n type impurity contained in n⁺ SiC substrate 11 can be formed.

Subsequently, on second main surface 12B, an oxide film made of silicon dioxide is formed by, for example, CVD (Chemical Vapor Deposition). Then, a resist is applied on the oxide film, and exposure and development are performed to form a resist film having an opening at a region corresponding to a desired shape of p body 13. Using the resist film as a mask, the oxide film is partially removed by, for example, RIE (Reactive Ion Etching), and thereby a mask layer made of the oxide film having an opening pattern is formed on n⁻ SiC layer 12. Thereafter, the resist film is removed, and, using the mask layer as a mask, ions of a p type impurity such as Al are implanted into n⁻ SiC layer 12 in a direction indicated by arrows to form p body 13 in n⁻ SiC layer 12. Subsequently, the oxide film used as a mask is removed, and a mask layer having an opening at a region corresponding to a desired shape of n⁺ source region 14 is formed. Using the mask layer as a mask, an n type impurity such as P (phosphorus) is introduced into n⁻ SiC layer 12 by ion implantation to form n⁺ source region 14. Then, a mask layer having an opening at a region corresponding to a desired shape of p⁺ region 18 is formed, and, using the mask layer as a mask, a p type impurity such as Al or B is introduced into n⁻ SiC layer 12 by ion implantation to form p⁺ region 18.

Subsequently, heat treatment for activating the impurities introduced by the ion implantation is performed. Specifically, n⁻ SiC layer 12 subjected to the ion implantation is heated to about 1700° C. in an Ar (argon) atmosphere and held for about 30 minutes, for example. Thereby, silicon carbide substrate 10 having second main surface 12B (FIG. 6) is prepared.

Figure 7:
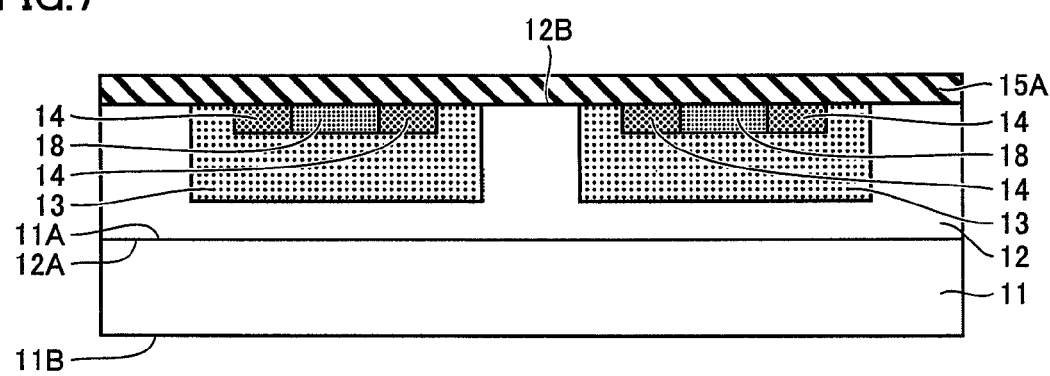
FIG. 7 is a schematic cross sectional view showing a third step of the method for manufacturing the MOSFET in accordance with Embodiment 1 of the present invention.
Figure 8:
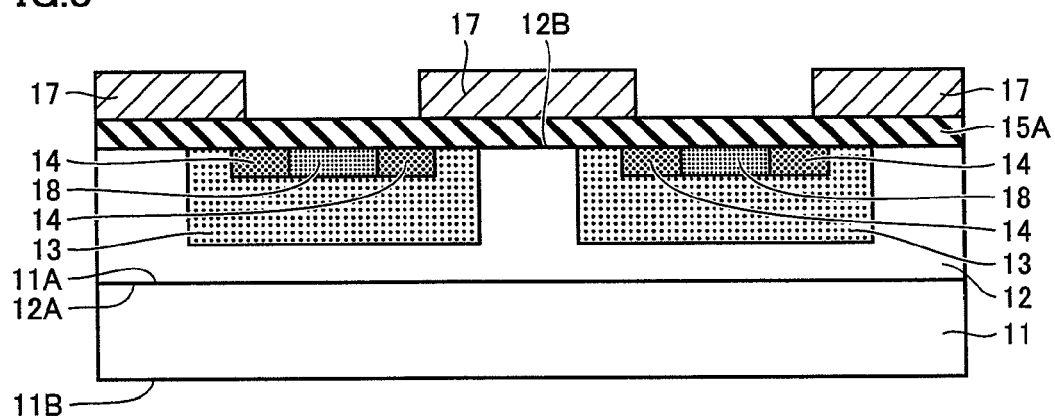
FIG. 8 is a schematic cross sectional view showing a fourth step of the method for manufacturing the MOSFET in accordance with Embodiment 1 of the present invention.

Referring to FIGS. 7 and 8, a gate insulating film formation step S20 (FIG. 3) is performed. Specifically, first, n⁺ substrate 11 subjected to step S10 (FIG. 3) and having n⁻ SiC layer 12 including desired ion-implanted regions formed therein is thermally oxidized. Thermal oxidation can be performed, for example, by heating the substrate to about 1300° C. in an oxygen atmosphere and holding it for about 40 minutes. Thereby, a thermally-oxidized film 15A made of silicon dioxide (with a thickness of, for example, about 50 nm) is formed on second main surface 12B.

Next, referring to FIG. 8, a gate electrode formation step S40 (FIG. 3) is performed. In this step, gate electrode 17 made of, for example, polysilicon, Al, or the like as a conductor is formed to extend from above one n⁺ source region 14 to above the other n⁺ source region 14 and to make contact with thermally-oxidized film 15A. When polysilicon is used as a material for gate electrode 17, polysilicon containing P at a high concentration of more than $1 \times 10^{20}$ cm⁻³ can be used as the polysilicon.

Figure 9:
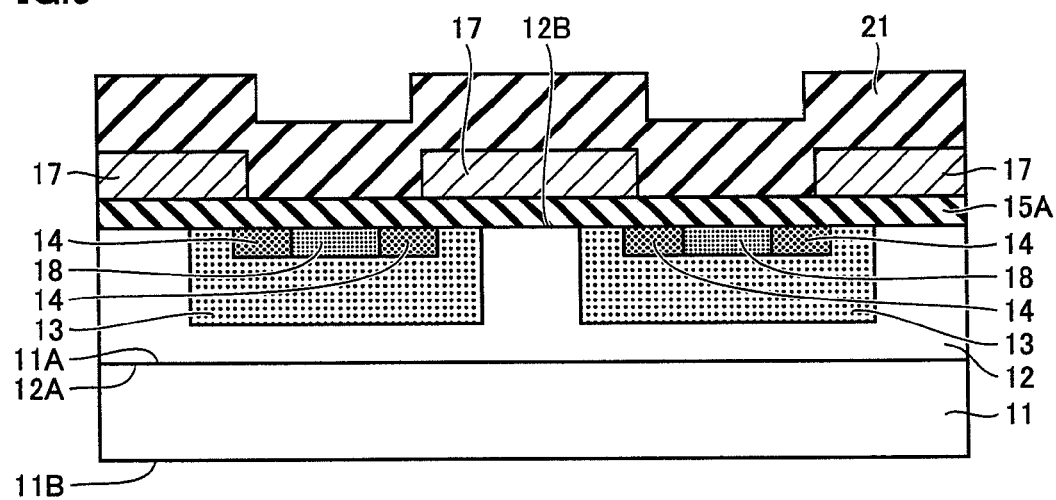
FIG. 9 is a schematic cross sectional view showing a fifth step of the method for manufacturing the MOSFET in accordance with Embodiment 1 of the present invention.
Figure 10:
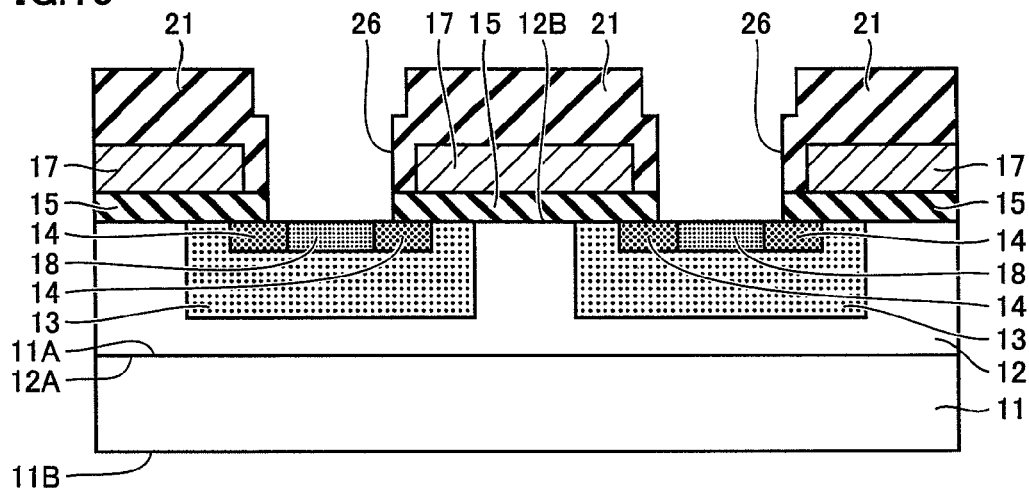
FIG. 10 is a schematic cross sectional view showing a sixth step of the method for manufacturing the MOSFET in accordance with Embodiment 1 of the present invention.

Next, referring to FIG. 9, an insulating film formation step S60 (FIG. 3) is performed. In this step, insulating film 21 made of, for example, silicon dioxide is formed by CVD to make contact with thermally-oxidized film 15A and to cover gate electrode 17. Next, referring to FIG. 10, an opening portion 26 for a source electrode portion is formed. Specifically, insulating film 21 and thermally-oxidized film 15A are partially removed to expose p⁺ region 18 and a portion of n⁺ source region 14.

Figure 11:
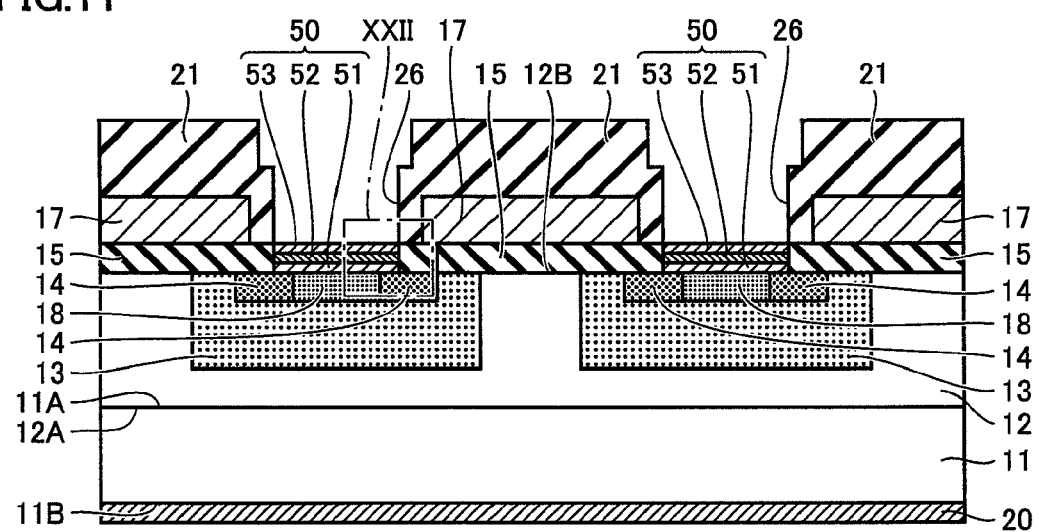
FIG. 11 is a schematic cross sectional view showing a seventh step of the method for manufacturing the MOSFET in accordance with Embodiment 1 of the present invention.
Figure 12:
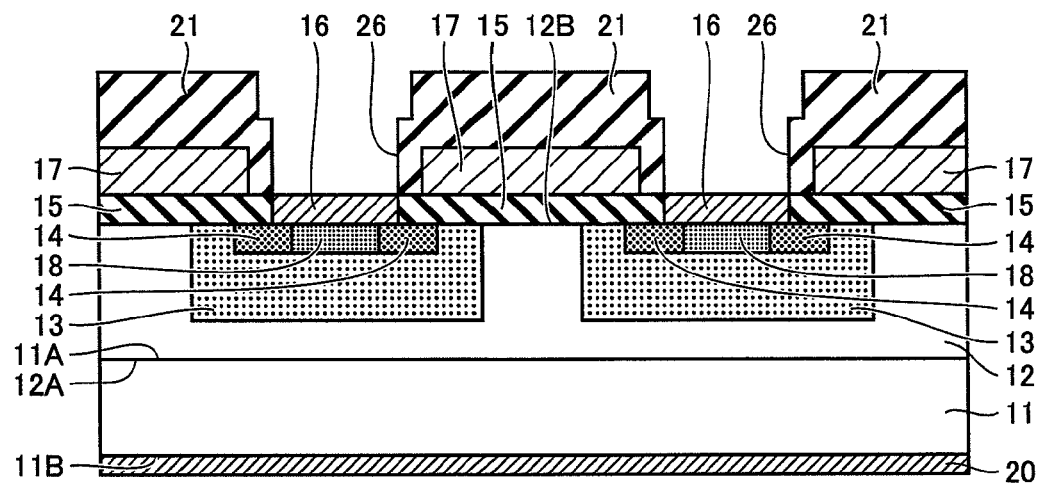
FIG. 12 is a schematic cross sectional view showing an eighth step of the method for manufacturing the MOSFET in accordance with Embodiment 1 of the present invention.

Referring to FIGS. 11 and 12, an ohmic electrode formation step S80 (FIG. 3) is performed.

Specifically, first, by a metal film formation step S81 (FIG. 4), a metal film 50 containing, for example, Si atoms, Ti atoms, and Al atoms is formed. Initially, for example, a resist pattern for exposing p⁺ region 18 and a portion of n⁺ source region 14 is formed, and metal film 50 is formed over an entire surface of the substrate by, for example, sputtering. Thereafter, the resist pattern is lifted off, for example, and thereby metal film 50 which is in contact with gate oxide film 15 and also in contact with p⁺ region 18 and n⁺ source region 14 is formed. It is noted that metal film 50 may be formed by another method such as dry etching.

Figure 22:
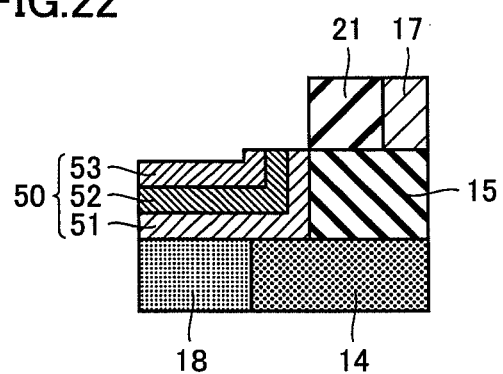
FIG. 22 is an enlarged view of a region XXII in FIG. 11.

Preferably, metal film 50 is a laminated film including a Ti layer 51, an Al layer 52, and a Si layer 53. Referring to FIG. 22, in metal film formation step S81 (FIG. 4), Ti layer 51 may be formed in contact with gate oxide film 15 made of silicon dioxide, and n⁺ source region 14 and p⁺ region 18 of silicon carbide substrate 10. Al layer 52 may be formed on Ti layer 51, and Si layer 53 may be formed on Al layer 52. In other words, Al layer 52 may be formed between Ti layer 51 and Si layer 53.

Preferably, Ti layer 51 has a film thickness of not less than 15 nm and not more than 25 nm, Al layer 52 has a film thickness of not less than 20 nm and not more than 60 nm, and Si layer 53 has a film thickness of not less than 15 nm and not more than 35 nm. It is noted that metal film 50 may be a mixed film formed by mixing a portion containing Ti, a portion containing Al, and a portion containing Si.

Figure 4:
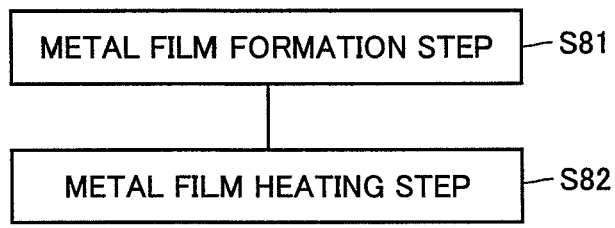
FIG. 4 is a flowchart showing details of an ohmic electrode formation step S80 in FIG. 3.

Referring to FIG. 11, in this step (S81: FIG. 4), drain electrode 20 is also formed to make contact with SiC substrate 11. As drain electrode 20, for example, an Ni electrode is used.

Next, a metal film heating step S82 (FIG. 4) is performed. In step S82 (FIG. 4), electrical connection between metal film 50 and silicon carbide substrate 10 becomes ohmic by annealing. Further, step S82 (FIG. 4) is performed in an atmosphere of an inert gas such as Ar and oxygen gas.

Figure 32:
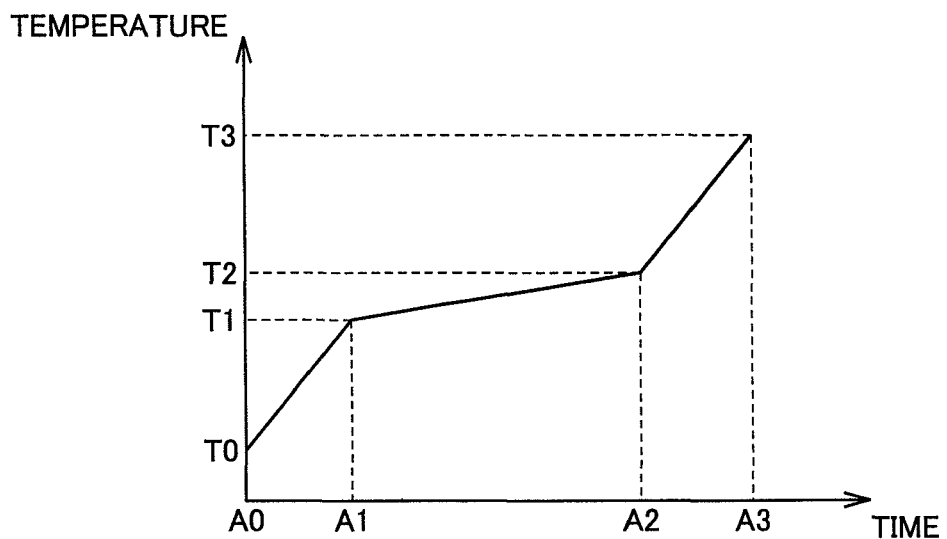
FIG. 32 is a view showing the relation between temperature of a metal film and time in a metal film heating step.

Specifically, referring to FIG. 32, from a time A0 to a time A1, temperature of metal film 50 is increased from a temperature T0 to a temperature T1 with a first temperature gradient. Temperature T0 is a temperature of less than 300° C., for example, room temperature. Temperature T1 is a temperature of not less than 300° C. and not more than 450° C. The first temperature gradient is a value obtained by dividing a temperature difference (T1−T0) between temperature T1 at time A1 and temperature T0 at time A0 by a time (A1−A0) taken for the temperature of metal film 50 to be increased from temperature T0 to temperature T1. For example, the temperature of metal film 50 is increased from temperature T0 of room temperature to temperature T1 of 300° C. in about 2 to 10 minutes. That is, the first temperature gradient is, for example, about 30 to 150° C. per minute.

Figure 33:
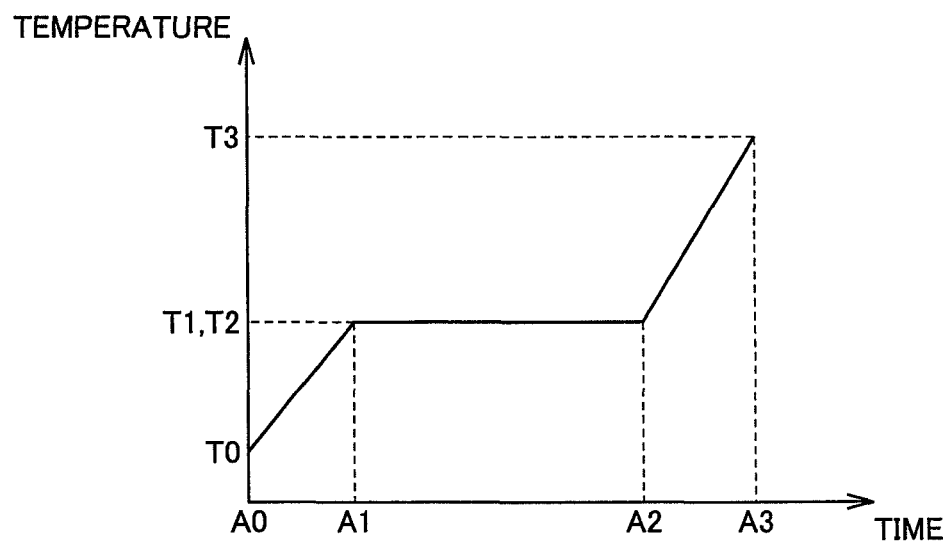
FIG. 33 is a view showing the relation between temperature of the metal film and time in the metal film heating step.

After the temperature of metal film 50 becomes not less than 300° C. and not more than 450° C., metal film 50 is held within a temperature range of not less than 300° C. and not more than 450° C. with a second temperature gradient. A time for holding metal film 50 within the temperature range of not less than 300° C. and not more than 450° C. is, for example, not less than 1 minute, and preferably not less than 2 minutes. The second temperature gradient is a value obtained by dividing a temperature difference (T2−T1) between a temperature T2 at a time A2 and temperature T1 at time A1 by a time (A2−A1) taken for the temperature of metal film 50 to be increased from temperature T1 to temperature T2. As shown in FIG. 32, the second temperature gradient is smaller than the first temperature gradient. Further, it is only necessary that the temperature of metal film 50 is held within the temperature range of not less than 300° C. and not more than 450° C., and the temperature of metal film 50 may vary within the temperature range. Preferably, the temperature of metal film 50 is maintained at a constant temperature within the temperature range of not less than 300° C. and not more than 450° C. between time A1 and time A2, as shown in FIG. 33. For example, the temperature of metal film 50 is maintained at 300° C. for 2 minutes. That is, the second temperature gradient is, for example, about 0° C. per minute.

After the temperature of metal film 50 is held at not less than 300° C. and not more than 450° C. for a constant time, the temperature of metal film 50 is increased from temperature T2 of not less than 300° C. and not more than 450° C. to a temperature T3 of not less than 500° C. with a third temperature gradient. The third temperature gradient is larger than the second temperature gradient. The temperature of metal film 50 is preferably increased from temperature T2 of not less than 300° C. and not more than 450° C. to temperature T3 of not less than 700° C., and more preferably to temperature T3 of not less than 1000° C. For example, the temperature of metal film 50 is increased from temperature T2 of not less than 300° C. and not more than 450° C. to temperature T3 of 1000° C. in about 2 minutes. That is, the third temperature gradient is, for example, about 300° C. per minute. Thereby, source contact electrode 16 which establishes ohmic contact with $n^+$ source region 14 and $p^+$ region 18 and makes contact with gate oxide film 15 made of silicon dioxide (FIG. 12) is completed.

It is noted that each of the first temperature gradient, the second temperature gradient, and the third temperature gradient is a value calculated from a difference between a temperature at a starting point and a temperature at an ending point in a time period. For example, the temperature of metal film 50 does not have to be increased with a constant temperature gradient between time A0 and time A1, and the temperature of metal film 50 may vary up and down between time A0 and time A1.

Metal film heating step S82 (FIG. 4) may have the step of removing Al (aluminum) from metal film 50 by performing wet etching on metal film 50 after holding metal film 50 within the temperature range of not less than 300° C. and not more than 450° C. with the second temperature gradient for a constant time and before increasing the temperature of metal film 50 to temperature T3 of not less than 500° C. Specifically, metal film 50 is held within the temperature range of not less than 300° C. and not more than 450° C. for a constant time, and then metal film 50 is taken out of an annealing apparatus. Thereafter, wet etching is performed on metal film 50 to remove Al. Al can be removed using a slightly alkaline solution such as a TMAH (tetramethyl ammonium hydroxide) solution, for example. Further, Al can be removed using an acidic solution such as phosphoric acid, acetic acid, and nitric acid, or a mixed solution thereof. By using the solution, Ti, Si, and $SiO_2$ are not etched, and only Al is selectively etched.

Figure 13:
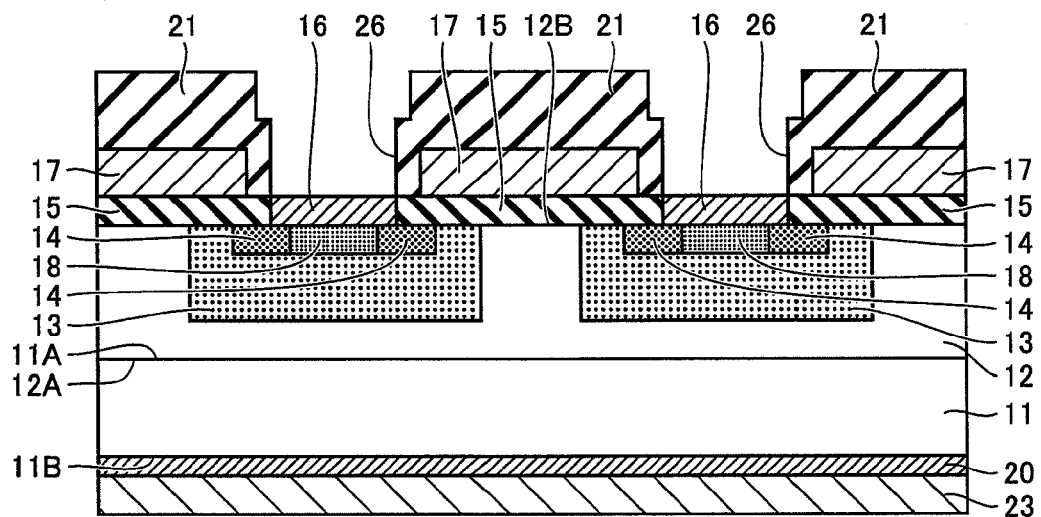
FIG. 13 is a schematic cross sectional view showing a ninth step of the method for manufacturing the MOSFET in accordance with Embodiment 1 of the present invention.

Next, referring to FIG. 13, back surface pad electrode 23 is formed. Back surface pad electrode 23 is formed to make contact with drain electrode 20. As back surface pad electrode 23, for example, a laminated film of Ni/Au is used. After back surface pad electrode 23 is formed, annealing is performed, for example, at a temperature of 400° C. for 20 minutes, to improve adhesiveness.

Figure 14:
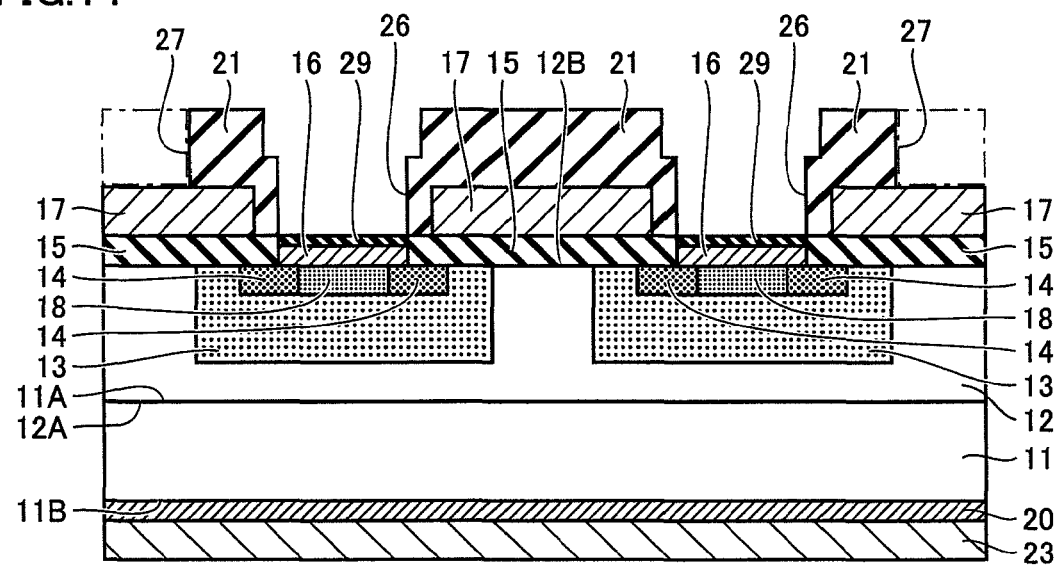
FIG. 14 is a schematic cross sectional view showing a tenth step of the method for manufacturing the MOSFET in accordance with Embodiment 1 of the present invention.
Figure 15:
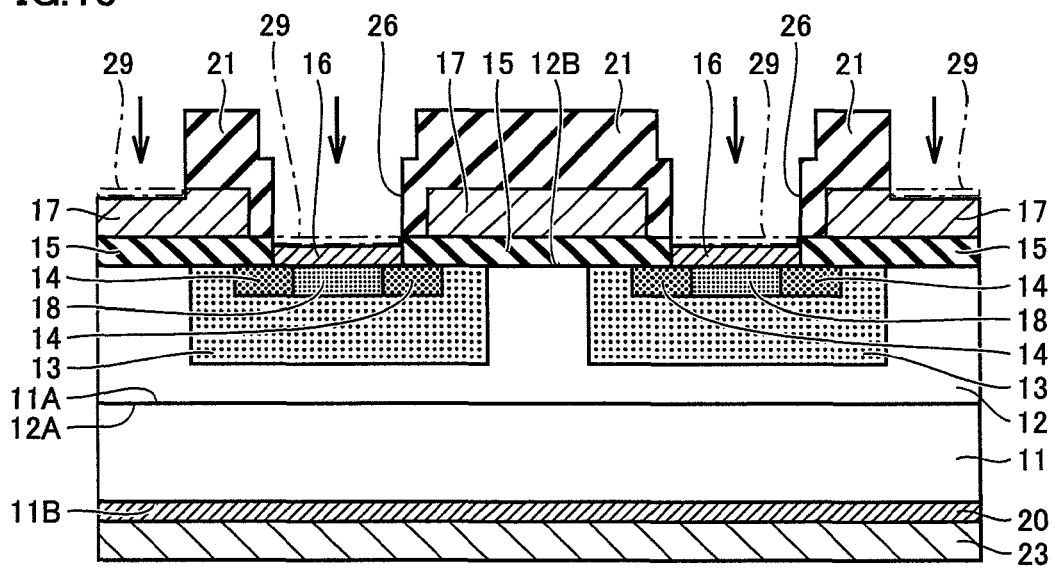
FIG. 15 is a schematic cross sectional view showing an eleventh step of the method for manufacturing the MOSFET in accordance with Embodiment 1 of the present invention.

Next, referring to FIG. 14, of a plurality of gate electrodes 17, a portion of insulating film 21 where the gate liner portion is to be subsequently formed is removed to form an opening portion 27, and a surface of gate electrode 17 is exposed. Further, ashing, baking in the air, or the like is performed to oxidize surfaces of source contact electrode 16 and gate electrode 17. Thus, referring to FIG. 15, an oxide film 29 formed on the surfaces of source contact electrode 16 and gate electrode 17 is removed by, for example, overall RIE or reverse sputtering.

Subsequently, source wire 19a and gate liner portion 19b are formed by a wire formation step S110 (FIG. 3). Specifically, a Ti/Al layer is formed over the entire surface of the substrate by, for example, an evaporation method. Thereafter, the Ti/Al layer is patterned by, for example, RIE or the like, to form source wire 19a in contact with source contact electrode 16 and gate liner portion 19b in contact with gate electrode 17. Thereby, MOSFET 1 shown in FIG. 1 is completed.

Next, function and effect of the method for manufacturing MOSFET 1 in accordance with the present embodiment will be described.

According to the method for manufacturing MOSFET 1 in accordance with the present embodiment, metal film 50 containing Al is held within the temperature range of not less than 300° C. and not more than 450° C. Thereby, Al is sufficiently silicidized, and thus unreacted Al (i.e., unsilicidized Al) is reduced. Accordingly, Al can be suppressed from reacting with gate oxide film 15 even when the temperature of the metal film is thereafter increased to not less than 500° C. As a result, insulation reliability of gate oxide film 15 can be improved.

Further, according to the method for manufacturing MOSFET 1 in accordance with the present embodiment, metal film 50 may further contain Si. Thereby, source contact electrode 16 having a low contact resistance to both the $n^+$ source region and the $p^+$ region can be manufactured.

Further, according to the method for manufacturing MOSFET 1 in accordance with the present embodiment, in the step of increasing the temperature of metal film 50 to a temperature of not less than 500° C., the temperature of metal film 50 is increased to a temperature of not less than 700° C. Thereby, metal film 50 can react with silicon carbide constituting silicon carbide substrate 10 and form an ohmic electrode.

Further, according to the method for manufacturing MOSFET 1 in accordance with the present embodiment, the step of forming metal film 50 has the steps of forming Ti layer 51 to make contact with silicon carbide substrate 10 and the silicon dioxide film, forming Al layer 52 on Ti layer 51, and forming Si layer 53 on Al layer 52. Thereby, a lower contact resistance to both $n^+$ source region 14 and $p^+$ region 18 can be achieved.

Further, according to the method for manufacturing MOSFET 1 in accordance with the present embodiment, the step of heating metal film 50 further has the step of removing Al by performing wet etching on metal film 50. The step of removing Al is performed after the step of holding the metal film within the temperature range of not less than 300° C. and not more than 450° C. and before the step of increasing the temperature of the metal film to a temperature of not less than 500° C. Thereby, Al can be effectively removed, and thus Al can be effectively suppressed from reacting with silicon dioxide.

Embodiment 2

Next, a configuration of a MOSFET 2 as a silicon carbide semiconductor device in accordance with Embodiment 2 of the present invention will be described with reference to FIG. 21.

Figure 21:
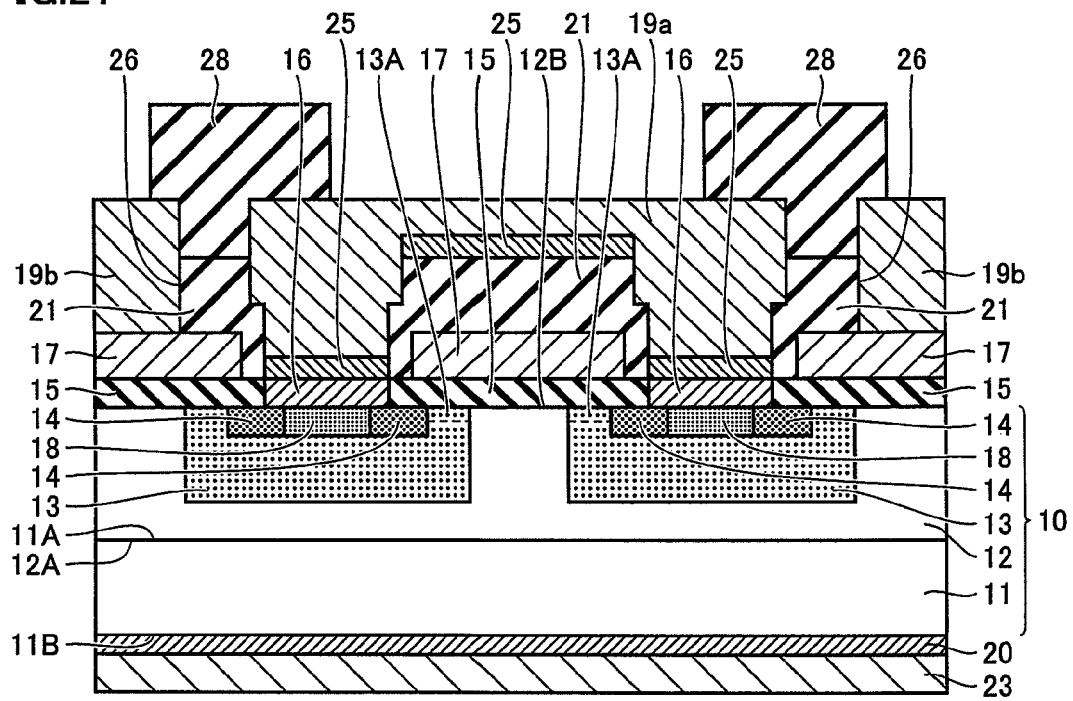
FIG. 21 is a schematic cross sectional view showing a configuration of the MOSFET in accordance with Embodiment 2 of the present invention.

As shown in FIG. 21, the configuration of MOSFET 2 in accordance with Embodiment 2 is different from the configuration of MOSFET 1 in accordance with Embodiment 1 in that an anti-oxidation layer 25 is formed on and in contact with source contact electrode 16 and insulating film 21, and is the same as the configuration of MOSFET 1 in other respects.

Next, a method for manufacturing MOSFET 2 in accordance with Embodiment 2 of the present invention will be described with reference to FIGS. 16 to 20.

First, the steps described in FIGS. 5 to 12 are performed as with MOSFET 1 in Embodiment 1 to prepare a substrate on which gate electrode 17 is covered with insulating film 21 and source contact electrode 16 and drain electrode 20 are formed (see FIG. 12).

Figure 16:
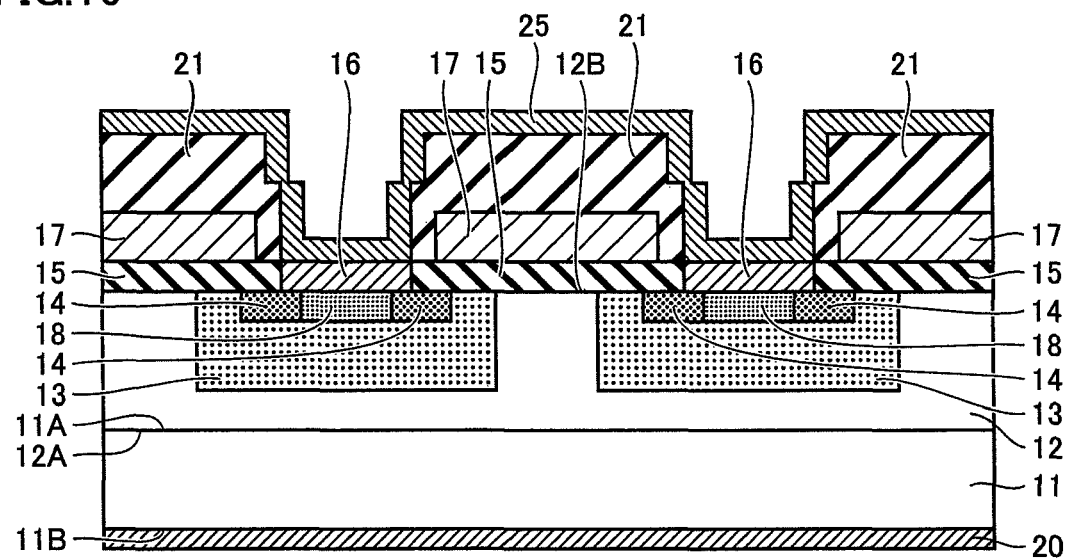
FIG. 16 is a schematic cross sectional view showing a ninth step of a method for manufacturing a MOSFET in accordance with Embodiment 2 of the present invention.

Subsequently, referring to FIG. 16, anti-oxidation layer 25 is formed over the entire surface of the substrate to make contact with insulating film 21 and source contact electrode 16. As anti-oxidation layer 25, for example, an evaporated film of Ti/W is used.

Figure 17:
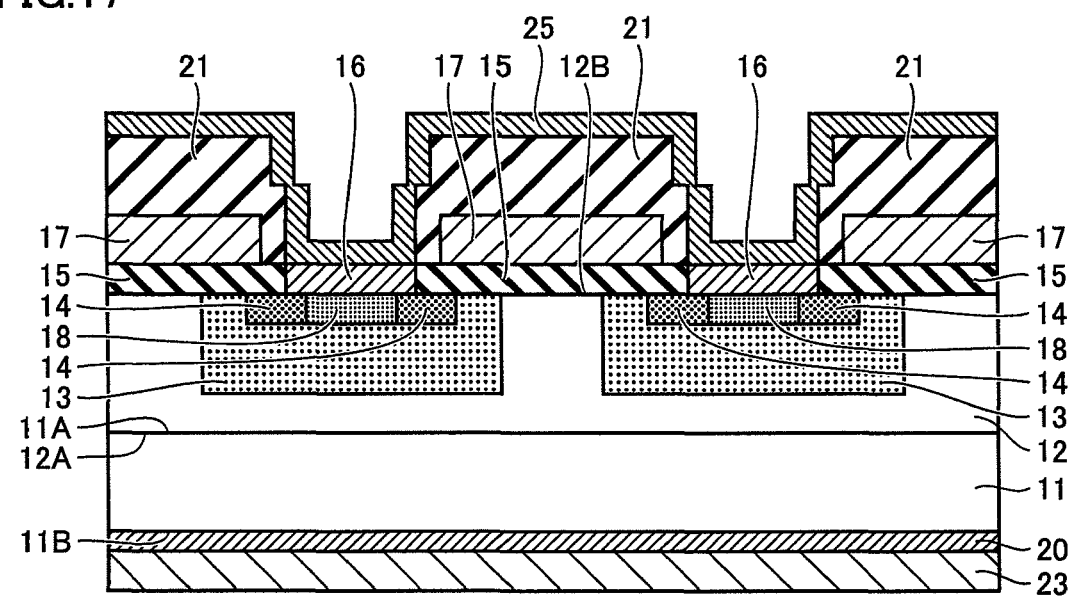
FIG. 17 is a schematic cross sectional view showing a tenth step of the method for manufacturing the MOSFET in accordance with Embodiment 2 of the present invention.

Next, referring to FIG. 17, back surface pad electrode 23 is formed. Back surface pad electrode 23 is formed to make contact with drain electrode 20. As back surface pad electrode 23, for example, a laminated film of Ni/Au is used. After back surface pad electrode 23 is formed, annealing is performed, for example, at a temperature of 400° C. for 20 minutes, to improve adhesiveness.

Figure 18:
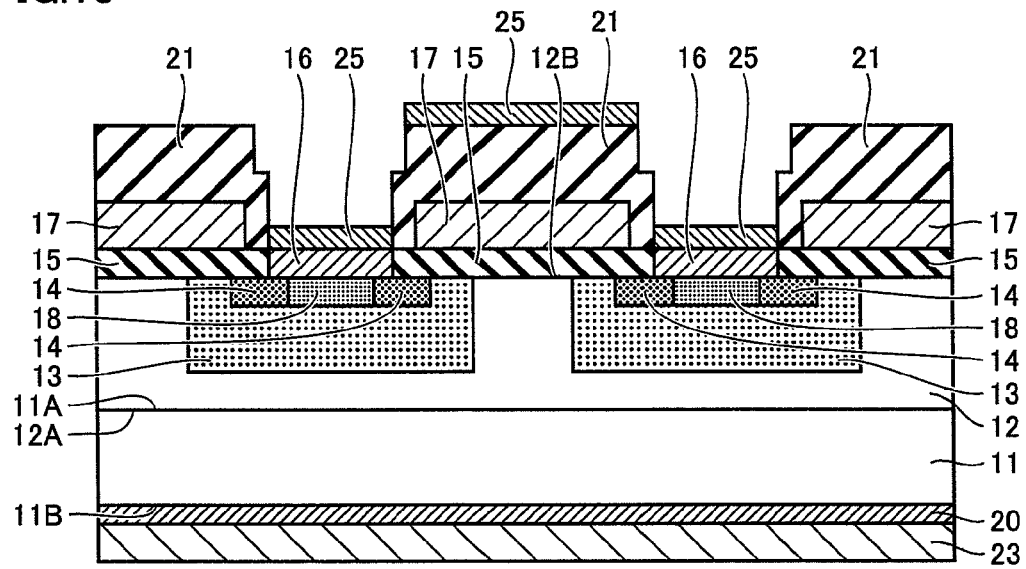
FIG. 18 is a schematic cross sectional view showing an eleventh step of the method for manufacturing the MOSFET in accordance with Embodiment 2 of the present invention.

Next, referring to FIG. 18, anti-oxidation layer 25 on insulating film 21 where an opening portion for subsequently forming the gate liner portion is to be formed is removed, and anti-oxidation layer 25 on source contact electrode 16 is left. It is noted that anti-oxidation layer 25 may be left on insulating film 21 where the gate liner portion is not to be formed.

Figure 19:
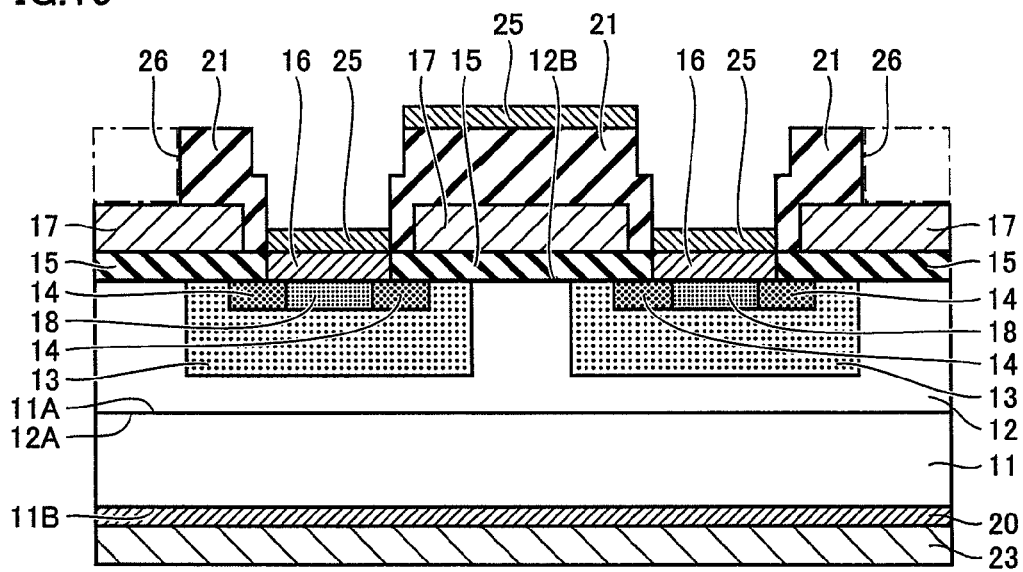
FIG. 19 is a schematic cross sectional view showing a twelfth step of the method for manufacturing the MOSFET in accordance with Embodiment 2 of the present invention.
Figure 20:
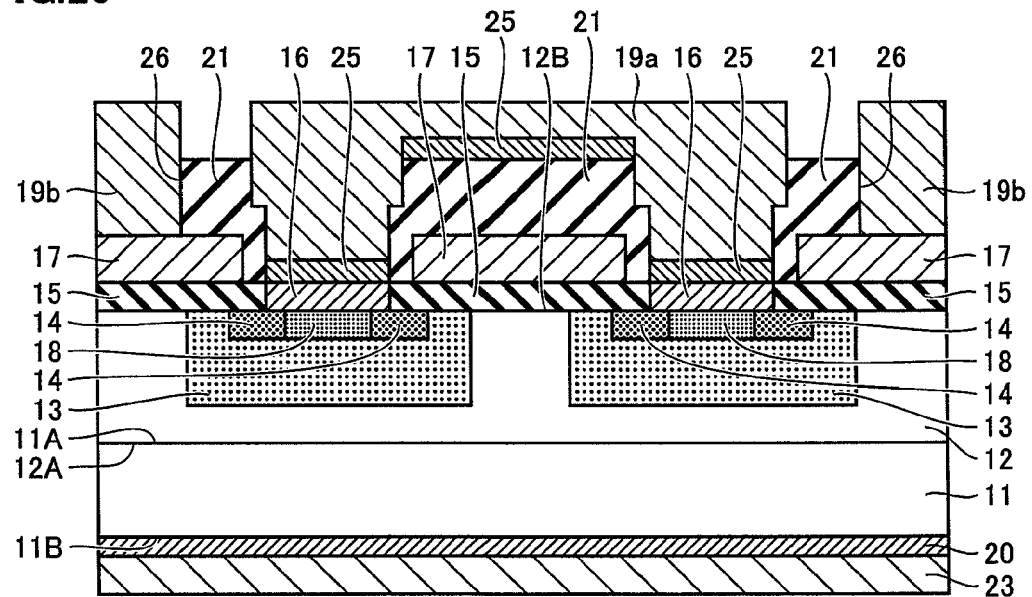
FIG. 20 is a schematic cross sectional view showing a thirteenth step of the method for manufacturing the MOSFET in accordance with Embodiment 2 of the present invention.

Subsequently, referring to FIG. 19, opening portion 26 is formed at a portion of insulating film 21 where the gate liner portion is to be formed. Then, referring to FIG. 20, gate liner portion 19b is formed in opening portion 26. Gate liner portion 19b is formed to make contact with gate electrode 17. Further, source wire 19a is formed to make contact with anti-oxidation layer 25 which is in contact with source contact electrode 16. Source wire 19a and gate liner portion 19b are made of, for example, a Ti/Al layer. Subsequently, a passivation film 28 in contact with insulating film 21, gate liner portion 19b, and source wire 19a is formed over the entire surface of the substrate. Thereafter, passivation film 28 is patterned such that portions of gate liner portion 19b and source wire 19a are opened. Thereby, MOSFET 2 shown in FIG. 21 is completed.

Embodiment 3

Next, a configuration of a JFET (Junction Field Effect Transistor) as a silicon carbide semiconductor device in the present embodiment will be described.

Figure 23:
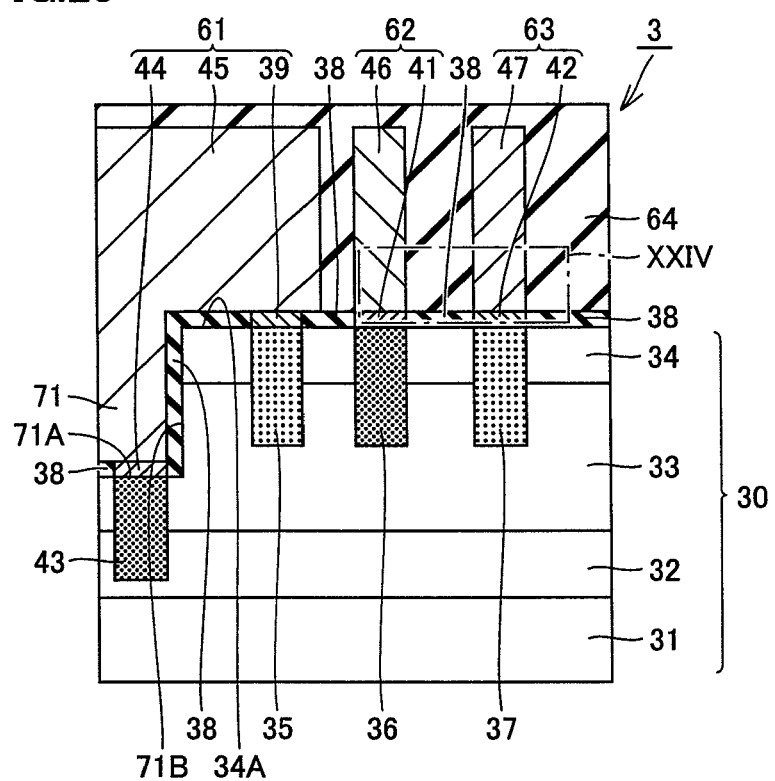
FIG. 23 is a schematic cross sectional view showing a configuration of a JFET (Junction Field Effect Transistor) in accordance with Embodiment 3 of the present invention.

Referring to FIG. 23, a JFET 3 has a silicon carbide substrate 30. Silicon carbide substrate 30 has an n type substrate 31, a first p type layer 32, an n type layer 33, and a second p type layer 34. N type substrate 31 is made of SiC and has n type conductivity. First p type layer 32 is formed on n type substrate 31. N type layer 33 is formed on first p type layer 32. Second p type layer 34 is formed on n type layer 33. First p type layer 32 can have a thickness of about 10 μm and a p type impurity concentration of about $7.5 \times 10^{15}$ cm$^{-3}$, for example. N type layer 33 can have a thickness of about 0.45 μm and an n type impurity concentration of about $2 \times 10^{17}$ cm$^{-3}$, for example. Second p type layer 34 can have a thickness of about 0.25 μm and a p type impurity concentration of about $2 \times 10^{17}$ cm$^{-3}$, for example.

In second p type layer 34 and n type layer 33, a first n type region 35 and a second n type region 37 containing an impurity having n type conductivity (i.e., an n type impurity) at a concentration higher than that of n type layer 33 (for example, about $1 \times 10^{20}$ cm$^{-3}$) are formed. In addition, in second p type layer 34 and n type layer 33, a first p type region 36 containing an impurity having p type conductivity (i.e., a p type impurity) at a concentration higher than those of first p type layer 32 and second p type layer 34 (for example, about $1 \times 10^{18}$ cm$^{-3}$) is formed to be sandwiched between first n type region 35 and second n type region 37. That is, first n type region 35, first p type region 36, and second n type region 37 are each formed to pass through second p type layer 34 and reach n type layer 33. Further, bottom portions of first n type region 35, first p type region 36, and second n type region 37 are arranged to be spaced from an upper surface of first p type layer 32 (i.e., a boundary portion between first p type layer 32 and n type layer 33).

Further, on a side opposite to first p type region 36 when viewed from first n type region 35, a groove portion 71 is formed to pass through second p type layer 34 from an upper surface 34A of second p type layer 34 (i.e., a main surface thereof opposite to a side facing n type layer 33) and reach n type layer 33. That is, a bottom surface 71A of groove portion 71 is located within n type layer 33 to be spaced from an interface between first p type layer 32 and n type layer 33. In addition, a second p type region 43 containing a p type impurity at a concentration higher than those of first p type layer 32 and second p type layer 34 (for example, about $1 \times 10^{18}$ cm$^{-3}$) is formed to pass through n type layer 33 from bottom surface 71A of groove portion 71 and reach first p type layer 32. A bottom portion of second p type region 43 is arranged to be spaced from an upper surface of n type substrate 31 (i.e., a boundary portion between n type substrate 31 and first p type layer 32).

Further, a source contact electrode 39, a gate contact electrode 41, a drain contact electrode 42, and a potential-holding contact electrode 44 as ohmic contact electrodes are formed to make contact with upper surfaces of first n type region 35, first p type region 36, second n type region 37, and second p type region 43, respectively. Source contact electrode 39, gate contact electrode 41, drain contact electrode 42, and potential-holding contact electrode 44 have the same characteristics as source contact electrode 16 in Embodiment 1.

An oxide film 38 as an interlayer insulating film is formed between each of source contact electrode 39, gate contact electrode 41, drain contact electrode 42, and potential-holding contact electrode 44 as ohmic contact electrodes and another adjacent ohmic contact electrode. Oxide film 38 is, for example, a silicon dioxide film. More specifically, oxide film 38 as an interlayer insulating film is formed on upper surface 34A of second p type layer 34 and bottom surface 71A and a side wall 71B of groove portion 71, to cover an entire region other than regions where source contact electrode 39, gate contact electrode 41, drain contact electrode 42, and potential-holding contact electrode 44 are formed. Thereby, insulation is established between adjacent ohmic contact electrodes.

Further, a source wire 45, a gate wire 46, and a drain wire 47 are formed to make contact with upper surfaces of source contact electrode 39, gate contact electrode 41, and drain contact electrode 42, respectively, and are electrically connected with the respective ohmic contact electrodes. Source wire 45 also makes contact with an upper surface of potential-holding contact electrode 44, and is also electrically connected with potential-holding contact electrode 44. That is, source wire 45 is formed to extend from above the upper surface of source contact electrode 39 to above the upper surface of potential-holding contact electrode 44, and thus potential-holding contact electrode 44 is held at the same potential as source contact electrode 39. Source wire 45, gate wire 46, and drain wire 47 are each composed of a conductor such as Al, for example. Source contact electrode 39 and source wire 45 constitute a source electrode 61, gate contact electrode 41 and gate wire 46 constitute a gate electrode 62, and drain contact electrode 42 and drain wire 47 constitute a drain electrode 63. Further, a passivation film 64 is formed to cover upper surfaces of source electrode 61, gate electrode 62, drain electrode 63, and oxide film 38. Passivation film 64 is made of, for example, silicon dioxide, and has functions of electrically insulating source electrode 61, gate electrode 62, and drain electrode 63 from outside and protecting JFET 3.

Figure 24:
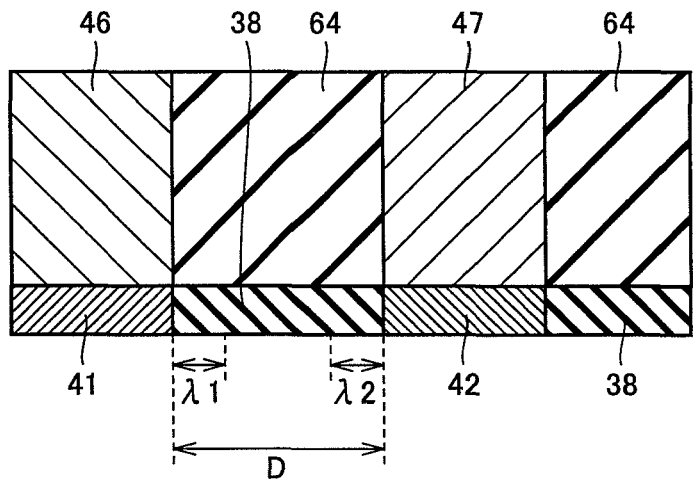
FIG. 24 is an enlarged view of a region XXIV in FIG. 23.

A configuration in the vicinity of gate contact electrode 41 and drain contact electrode 42 will be described with reference to FIG. 24.

Gate contact electrode 41 and drain contact electrode 42 of JFET 3 in the present embodiment are provided on silicon carbide substrate 30, and are in contact with oxide film 38 made of silicon dioxide. Each of gate contact electrode 41 and drain contact electrode 42 contains Ti atoms and Al atoms. Preferably, each of gate contact electrode 41 and drain contact electrode 42 further contains Si atoms. Gate contact electrode 41 and drain contact electrode 42 are insulated from each other by oxide film 38. In other words, gate contact electrode 41 (a first electrode) and drain contact electrode 42 (a second electrode) are separated from each other by the silicon dioxide film.

When a metal film containing Al is subjected to annealing to form an electrode, Al contained in the metal film may diffuse into a silicon dioxide film. In the present embodiment, it is assumed that Al diffuses into oxide film 38 located between gate contact electrode 41 (the first electrode) and drain contact electrode 42 (the second electrode). In JFET 3 in the present embodiment, a region where Al having an atomic ratio of not less than 1% penetrates from gate contact electrode 41 (the first electrode) to oxide film 38 (silicon dioxide film) (penetration length: $\lambda 1$) is not more than 25% of a distance D between gate contact electrode 41 (the first electrode) and drain contact electrode 42 (the second electrode). Further, a region where Al having an atomic ratio of not less than 1% penetrates from drain contact electrode 42 (the second electrode) to oxide film 38 (silicon dioxide film) (penetration length: $\lambda 2$) is not more than 25% of distance D between gate contact electrode 41 (the first electrode) and drain contact electrode 42 (the second electrode). That is, a total value of penetration length $\lambda 1$ and penetration length $\lambda 2$ is not more than 50% of distance D.

More preferably, each of penetration length $\lambda 1$ and penetration length $\lambda 2$ is not more than 5% of distance D. Specifically, each of penetration length $\lambda 1$ and penetration length $\lambda 2$ is not more than 0.25 μm, and preferably not more than 0.05 μm.

It is noted that, although gate contact electrode 41 has been described above as the first electrode and drain contact electrode 42 has been described above as the second electrode, the present invention is not limited thereto. For example, drain contact electrode 42 may be the first electrode and gate contact electrode 41 may be the second electrode. Further, source contact electrode 39 may be the first electrode and gate contact electrode 41 may be the second electrode.

Next, an operation of JFET 3 will be described. Referring to FIG. 23, when gate electrode 62 has a voltage of 0 V, a region sandwiched between first p type region 36 and second n type region 37, a region sandwiched between the above sandwiched region and first p type layer 32 (drift region), and a region sandwiched between first p type region 36 and first p type layer 32 (channel region) are not depleted in n type layer 33, and first n type region 35 and second n type region 37 are electrically connected with each other via n type layer 33. Therefore, electrons move from first n type region 35 to second n type region 37, and thus a current flows.

On the other hand, when a negative voltage is applied to gate contact electrode 41, depletion of the channel region and the drift region proceeds, and first n type region 35 and second n type region 37 are electrically disconnected from each other. Therefore, electrons cannot move from first n type region 35 to second n type region 37, and thus no current flows.

Next, a method for manufacturing JFET 3 in Embodiment 3 will be described.

Figure 25:
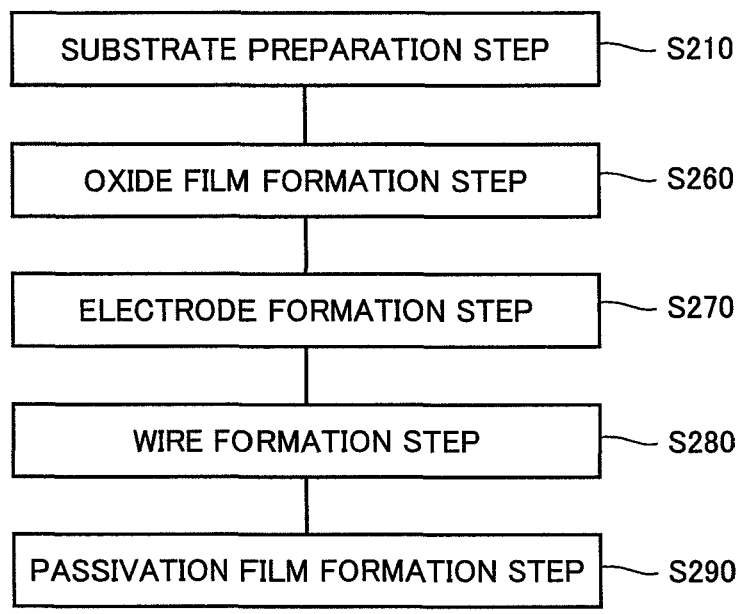
FIG. 25 is a flowchart schematically showing a method for manufacturing the JFET in accordance with Embodiment 3 of the present invention.
Figure 26:
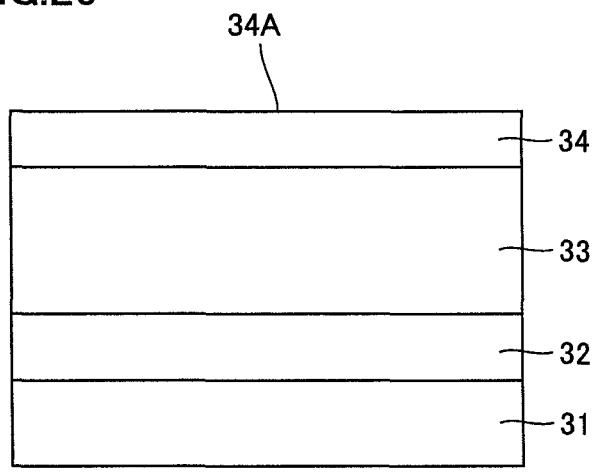
FIG. 26 is a schematic cross sectional view showing a first step of the method for manufacturing the JFET in accordance with Embodiment 3 of the present invention.
Figure 27:
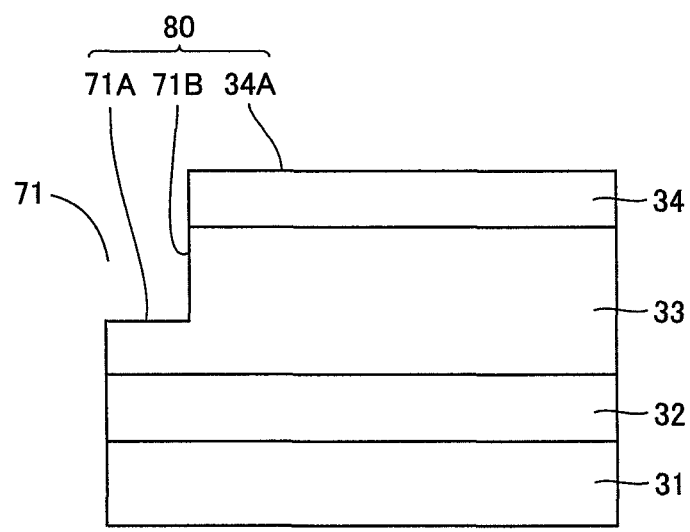
FIG. 27 is a schematic cross sectional view showing a second step of the method for manufacturing the JFET in accordance with Embodiment 3 of the present invention.
Figure 28:
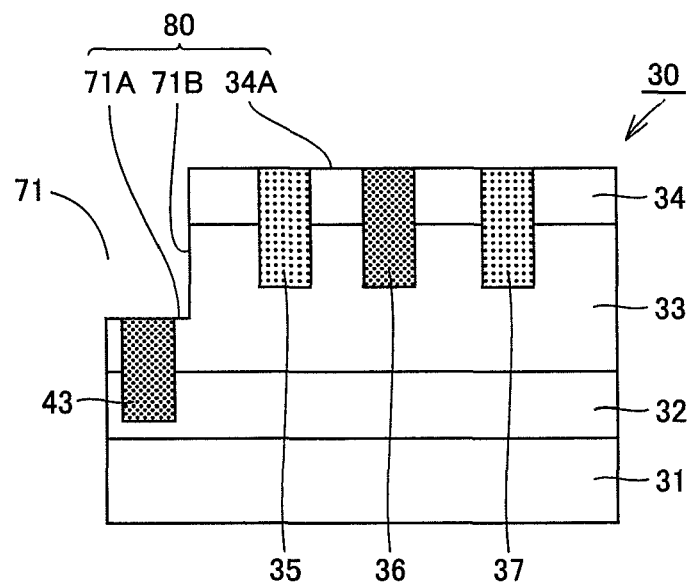
FIG. 28 is a schematic cross sectional view showing a third step of the method for manufacturing the JFET in accordance with Embodiment 3 of the present invention.

Referring to FIGS. 26 to 28, first, silicon carbide substrate 30 is prepared by a substrate preparation step S210 (FIG. 25).

Specifically, referring to FIG. 26, first, on n type substrate 31, first p type layer 32, n type layer 33, and second p type layer 34 made of SiC are sequentially formed on one main surface of n type substrate 31. For this formation, for example, a vapor phase epitaxial growth method is used. In vapor phase epitaxial growth, for example, silane ($SiH_4$) gas and propane ($C_3H_8$) gas can be used as source gases, and hydrogen ($H_2$) gas can be used as a carrier gas. Further, as a p type impurity source for forming the p type layers, for example, diborane ($B_2H_6$) or trimethylaluminum (TMA) can be used, and, as an n type impurity for forming the n type layer, for example, nitrogen can be used. Thereby, first p type layer 32 and second p type layer 34 containing a p type impurity such as Al or B, and n type layer 33 containing an n type impurity such as N are formed.

Next, referring to FIG. 27, groove portion 71 is formed to pass through second p type layer 34 from upper surface 34A of second p type layer 34 and reach n type layer 33. Groove portion 71 has bottom surface 71A and side wall 71B. Formation of groove portion 71 can be performed, for example, by forming a mask layer having an opening at a desired position for forming groove portion 71 on upper surface 34A of second p type layer 34, and thereafter performing dry etching using $SF_6$ gas.

Subsequently, referring to FIG. 28, ion implantation is performed. Specifically, first, on upper surface 34A of second p type layer 34 and the bottom surface of groove portion 71, an oxide film made of silicon dioxide is formed by, for example, CVD. Then, a resist is applied on the oxide film, and exposure and development are performed to form a resist film having an opening at a region corresponding to a desired shape of each of first n type region 35 and second n type region 37. Using the resist film as a mask, the oxide film is partially removed by, for example, RIE, and thereby a mask layer made of the oxide film having an opening pattern is formed on upper surface 34A of second p type layer 34. Thereafter, the resist film is removed, and, using the mask layer as a mask, ion implantation is performed on n type layer 33 and second p type layer 34. As ion species to be implanted, for example, P (phosphorus), N (nitrogen), or the like can be used. Thereby, first n type region 35 and second n type region 37 which pass through second p type layer 34 and reach n type layer 33 are formed.

Further, the mask layer used to form first n type region 35 and second n type region 37 is removed, and then a mask layer having an opening at a region corresponding to a desired shape of each of first p type region 36 and second p type region 43 is formed on upper surface 34A of second p type layer 34 and bottom surface 71A of groove portion 71, by the same procedure. Using the mask layer as a mask, ion implantation is performed on first p type layer 32, n type layer 33, and second p type layer 34. As ion species to be implanted, for example, Al (aluminum), B (boron), or the like can be used.

Thereby, first p type region 36 which passes through second p type layer 34 and reach n type layer 33, and second p type region 43 which passes through n type layer 33 from bottom surface 71A of groove portion 71 and reach first p type layer 32 are formed.

Subsequently, heat treatment for activating the impurities is performed. Specifically, n type substrate 31 having first p type layer 32, n type layer 33, and second p type layer 34 for which the ion implantation has been completed is heated to 1700° C. in an atmosphere of an inert gas such as argon and held for 30 minutes, for example. Thus, the impurities can be activated and serve as an n type impurity and a p type impurity.

Thereby, silicon carbide substrate 30 having a substrate surface 80 including upper surface 34A, bottom surface 71A, and side wall 71B (FIG. 28) is prepared.

Figure 29:
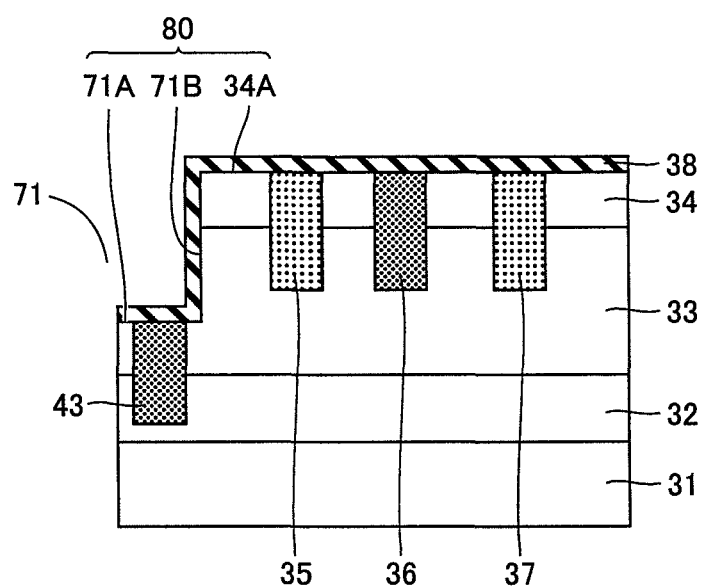
FIG. 29 is a schematic cross sectional view showing a fourth step of the method for manufacturing the JFET in accordance with Embodiment 3 of the present invention.
Figure 30:
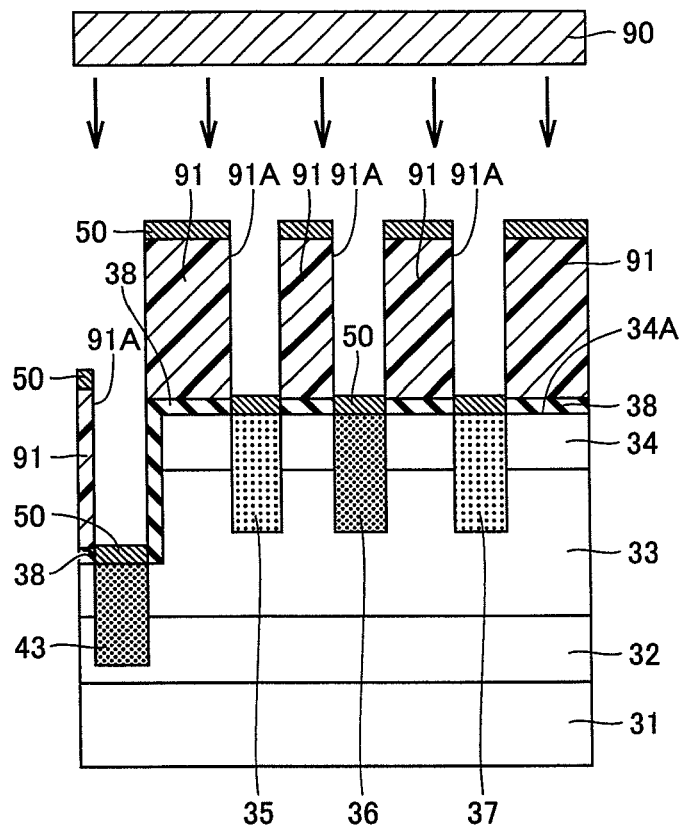
FIG. 30 is a schematic cross sectional view showing a fifth step of the method for manufacturing the JFET in accordance with Embodiment 3 of the present invention.

Referring to FIGS. 29 and 30, next, oxide film 38 is formed by an oxide film formation step S260 (FIG. 25).

Specifically, first, oxide film 38 (field oxide film) as an insulating film covering upper surface 34A of second p type layer 34 and bottom surface 71A and side wall 71B of groove portion 71 is formed by performing thermal oxidation treatment which heats the substrate to about 1300° C. in an oxygen atmosphere and holds it for about 90 minutes, for example. Oxide film 38 has a thickness of, for example, about 0.1 μm.

Then, a resist is applied on oxide film 38, and exposure and development are performed to form a resist film 91 having openings 91A corresponding to regions where source contact electrode 39, gate contact electrode 41, drain contact electrode 42, and potential-holding contact electrode 44 (see FIG. 23) are to be formed. Using resist film 91 as a mask, oxide film 38 is partially removed by, for example, RIE. Thereby, oxide film 38 (FIG. 30) partially covering substrate surface 80 (FIG. 29) is formed.

Next, an electrode formation step S270 (FIG. 25) is performed. This step (S270) can be performed as with the ohmic electrode formation step (S80: FIG. 3) in Embodiment 1. Specifically, first, as with the metal film formation step (S81: FIG. 4) in Embodiment 1, metal film 50 is formed on resist film 91 and in regions exposed from resist film 91. Further, by removing resist film 91, metal film 50 on resist film 91 is removed (lifted off), and thus metal film 50 remains on and in contact with first n type region 35, first p type region 36, second n type region 37, and second p type region 43.

Preferably, metal film 50 is a laminated film including Ti layer 51, Al layer 52, and Si layer 53. In metal film formation step S81 (FIG. 4), Ti layer 51 is formed in contact with oxide film 38 made of silicon dioxide, and first p type layer 32 of silicon carbide substrate 30. Al layer 52 is formed on Ti layer 51. Si layer 53 is formed on Al layer 52. In other words, Al layer 52 is formed between Ti layer 51 and Si layer 53.

Preferably, layer 51 containing Ti has a film thickness of not less than 15 nm and not more than 25 nm, layer 52 containing Al has a film thickness of not less than 20 nm and not more than 60 nm, and layer 53 containing Si has a film thickness of not less than 15 nm and not more than 35 nm. It is noted that metal film 50 may be a mixed film formed by mixing a portion containing Ti, a portion containing Al, and a portion containing Si.

Figure 31:
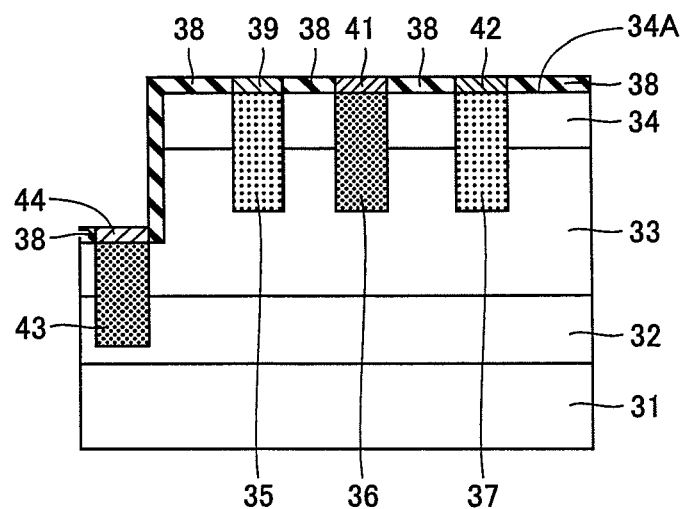
FIG. 31 is a schematic cross sectional view showing a sixth step of the method for manufacturing the JFET in accordance with Embodiment 3 of the present invention.

Further referring to FIG. 31, as in metal film heating step S82 (FIG. 4) in Embodiment 1, electrical connection between metal film 50 and silicon carbide substrate 30 becomes ohmic by annealing. Metal film heating step S82 (FIG. 4) has the steps of increasing temperature of metal film 50 from a temperature of less than 300° C. to a temperature of not less than 300° C. and not more than 450° C. with a first temperature gradient, thereafter holding metal film 50 within a temperature range of not less than 300° C. and not more than 450° C. with a second temperature gradient, and thereafter increasing the temperature of metal film 50 to a temperature of not less than 500° C. with a third temperature gradient. Here, the second temperature gradient is smaller than the first temperature gradient and the third temperature gradient. In the step of increasing the temperature of metal film 50 to a temperature of not less than 500° C., the temperature of metal film 50 is preferably increased to not less than 700° C., and more preferably increased to not less than 1000° C. Thereby, source contact electrode 39, the gate contact electrode, and drain contact electrode 42 which establish ohmic contact with silicon carbide substrate 30 are completed.

As a result, source contact electrode 39, gate contact electrode 41, drain contact electrode 42, and potential-holding contact electrode 44 as ohmic contact electrodes are formed to make contact with the upper surfaces of first n type region 35, first p type region 36, second n type region 37, and second p type region 43, respectively.

Metal film heating step S82 (FIG. 4) may have the step of removing Al (aluminum) from metal film 50 by performing wet etching on metal film 50 after holding metal film 50 within the temperature range of not less than 300° C. and not more than 450° C. with the second temperature gradient for a constant time and before increasing the temperature of metal film 50 to temperature T3 of not less than 500° C. Specifically, metal film 50 is held within the temperature range of not less than 300° C. and not more than 450° C. for a constant time, and then metal film 50 is taken out of an annealing apparatus. Thereafter, wet etching is performed on metal film 50 to remove Al. Al can be removed using a slightly alkaline solution such as a TMAH solution, for example. Further, Al can be removed using an acidic solution such as phosphoric acid, acetic acid, and nitric acid, or a mixed solution thereof. By using the solution, Ti, Si, and $SiO_2$ are not etched, and only Al is selectively etched.

As a result, source contact electrode 39, gate contact electrode 41, drain contact electrode 42, and potential-holding contact electrode 44 as ohmic contact electrodes are formed to make contact with the upper surfaces of first n type region 35, first p type region 36, second n type region 37, and second p type region 43, respectively.

Referring to FIG. 23 again, a wire formation step S280 (FIG. 25) is performed. Specifically, source wire 45, gate wire 46, and drain wire 47 are formed to make contact with the upper surfaces of source contact electrode 39, gate contact electrode 41, and drain contact electrode 42, respectively. Source wire 45, gate wire 46, and drain wire 47 can be formed, for example, by forming a resist layer having openings at desired regions where source wire 45, gate wire 46, and drain wire 47 are to be formed, evaporating Al, and thereafter removing (lifting off) Al on the resist layer together with the resist layer.

Next, a passivation film formation step S290 (FIG. 25) is performed. Specifically, passivation film 64 made of, for example, silicon dioxide is formed to cover the upper surfaces of source electrode 61, gate electrode 62, drain electrode 63, and oxide film 38. Formation of passivation film 64 can be performed by, for example, CVD. Thereby, JFET 3 is completed. It is noted that JFET 3 in accordance with Embodiment 3 has the same function and effect as the MOSFET in accordance with Embodiment 1.

Further, a configuration with n type and p type in each of the above embodiments being reversed may be used. Furthermore, although a MOSFET and a JFET have been described as examples of the semiconductor device in accordance with the present invention, other semiconductor devices such as an IGBT (Insulated Gate Bipolar Transistor) and a bipolar transistor may be manufactured.

Example 1

First, in order to determine the composition of metal film 50, an experiment for investigating its contact resistance to a silicon carbide substrate was conducted with thicknesses of the Ti layer, the Al layer, and the Si layer being changed in a matrix manner. As the thickness of the Ti layer, three types of thicknesses (15 nm, 20 nm, and 25 nm) were selected. As the thickness of the Al layer, three types of thicknesses (20 nm, 40 nm, and 60 nm) were selected. As the thickness of the Si layer, three types of thicknesses (15 nm, 25 nm, and 35 nm) were selected. Twenty-seven types of samples (three types of the Ti layer×three types of the Al layer×three types of the Si layer) were prepared by changing the thicknesses of the Ti layer, the Al layer, and the Si layer. For each of the 27 types of samples, contact resistances to an n type silicon carbide substrate and to a p type silicon carbide substrate were evaluated using a TEG (Test Element Group).

Temperatures of the 27 types of samples were increased to 300° C. using an RTA apparatus. Then, the samples were held at 300° C. for 3 minutes, and thereafter the temperatures of the samples were increased to 1000° C. in about 2 minutes. As a result, for the n type silicon carbide substrate, a sample under a condition A in which the Ti layer was 15 nm thick, the Al layer was 60 nm thick, and the Si layer was 25 nm thick had the highest contact resistivity. For the p type silicon carbide substrate, a sample under a condition B in which the Ti layer was 25 nm thick, the Al layer was 20 nm thick, and the Si layer was 15 nm thick had the highest contact resistivity.

Next, a MOSFET was fabricated to investigate the influence of holding temperature and holding time for a metal layer on leak current, n type contact resistance, and p type contact resistance of a silicon carbide semiconductor device.

First, an n type silicon carbide substrate was prepared. An n type silicon carbide epitaxial layer was formed on the n type silicon carbide substrate. A p type region and an n type region were formed in the epitaxial layer by ion implantation. Thereafter, activation annealing was performed to repair damage caused by the ion implantation. The activation annealing was performed at a temperature of 1700° C. for 30 minutes.

Then, a 1 μm-thick silicon dioxide film was formed by the CVD method. A gate electrode was formed by forming P (phosphorus)-doped polysilicon. A contact hole for forming an electrode was formed in the silicon dioxide film by performing dry etching on the silicon dioxide film. Metal film 50 including three layers of Ti/Al/Si was formed in the contact hole and to make contact with the silicon dioxide film. A 1000 angstrom-thick Ni electrode was formed over the entire back surface of the silicon carbide substrate.

Subsequently, heat treatment was performed on metal film 50. The heat treatment was performed by placing metal film 50 into a lamp annealing furnace and holding it at a temperature of 300° C. for 1 to 5 minutes. Thereby, silicidation reaction within the three layers of Ti/Al/Si was almost completed. Thereafter, the silicon carbide substrate having metal film 50 formed therein was taken out of the lamp annealing furnace, and subjected to etching with a TMAH solution for 10 minutes. The TMAH solution had a concentration of 2.38%. It is noted that Al is etched with the TMAH solution, whereas Ti, Si, and $SiO_2$ are not etched with the TMAH solution. Further, Al having reacted with Si or Ti is not etched with the TMAH solution.

Then, the silicon carbide substrate having metal film 50 formed therein was placed into the lamp annealing furnace, and the temperature thereof was increased to a temperature of 1000° C. in 2 minutes. Thereafter, the temperature of the silicon carbide substrate having metal film 50 formed therein was held for 1 minute, and then the silicon carbide substrate was cooled. Thereby, contact electrodes were formed on front and back surfaces of the silicon carbide substrate.

Subsequently, a back surface electrode pad made of Ti/Pt/Au was formed on the back surface. A contact hole was formed above the gate electrode to form an electrode pad made of TiN/Al. Then, SiN was formed as a passivation film on the front surface side. Thereafter, openings were formed above a gate electrode portion and a source electrode portion. Simultaneously with the fabrication of the MOSFET, a TEG for evaluating contact resistance was also fabricated.

Figure 34:
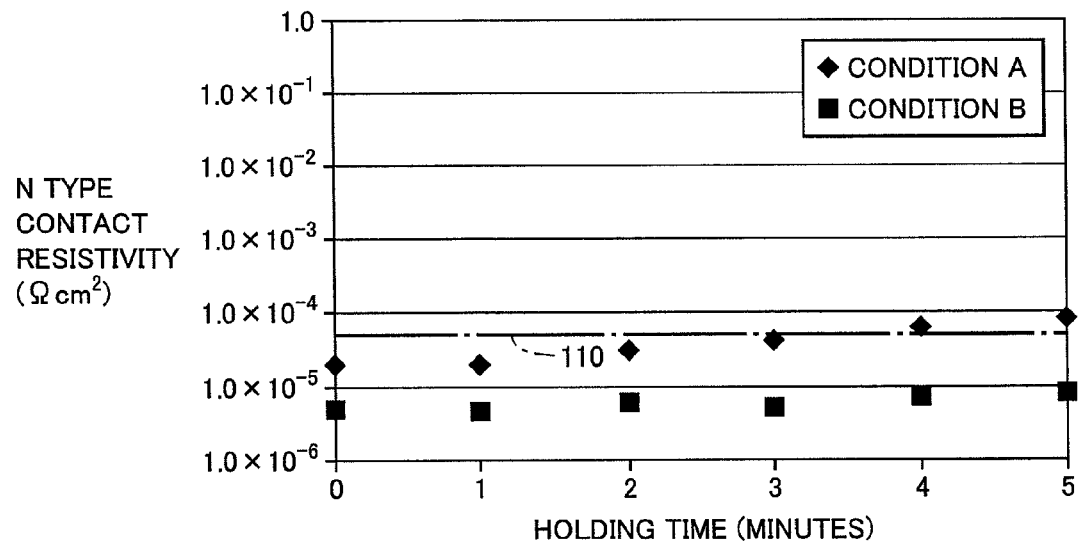
FIG. 34 is a view showing the relation between n type contact resistivity and holding time.

Referring to FIG. 34, dependence of contact resistivity between the n type silicon carbide substrate and the contact electrode (source contact electrode) on holding time will be described. As shown in FIG. 34, as the holding time increased, the contact resistivity between the n type silicon carbide substrate and the contact electrode (source contact electrode) gradually increased. An upper limit line 110 is a line indicating a contact resistivity of $5 \times 10^{-5}$ $\Omega cm^2$. If the contact resistivity is higher than this value, the contact resistivity is of the order of not less than 1% of device performance, and thus is not negligible. In other words, if the contact resistivity is not more than upper limit line 110, it is at a level causing no problem as device performance. In the sample under condition A having the highest contact resistance to n type silicon carbide, it was confirmed that, if the holding time is not more than 3 minutes, there is no problem as a device characteristic.

Figure 35:
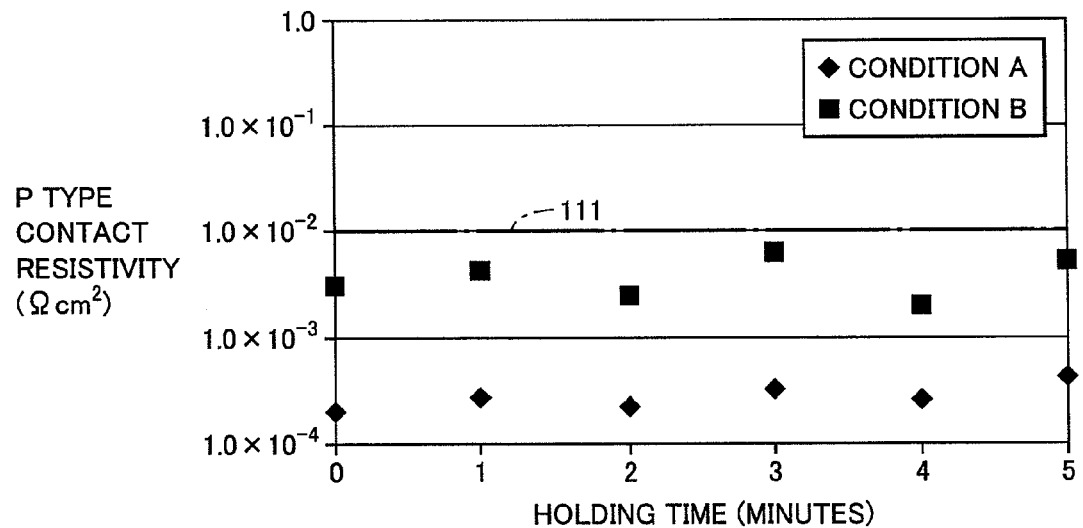
FIG. 35 is a view showing the relation between p type contact resistivity and holding time.

Referring to FIG. 35, dependence of contact resistivity between a p type silicon carbide substrate and the contact electrode (source contact electrode) on holding time will be described. As shown in FIG. 35, the contact resistivity between the p type silicon carbide substrate and the contact electrode was less influenced even when the holding time varied. An upper limit line 111 is a line indicating a contact resistivity of $1 \times 10^{-2}$ $\Omega cm^2$. If the contact resistivity is higher than this value, a delay occurs in the gate electrode portion, causing deterioration of dynamic characteristics. In other words, if the contact resistivity is not more than upper limit line 111, it is at a level causing no problem as a dynamic characteristic. In the sample under condition B having the highest contact resistance to p type silicon carbide, it was confirmed that there is no problem as a dynamic characteristic, irrespective of the holding time.

Next, leak current between a gate and a source of MOSFET 1 was measured. As the leak current, a current having the maximum value obtained when a voltage changed between −5 V and 20 V was applied between the gate and the source was measured. When TiAlSi constituting the source electrode of MOSFET 1 reacts with silicon dioxide, a short circuit occurs between the source electrode and the gate electrode, and the leak current between the source electrode and the gate electrode increases. If the leak current has a value exceeding 1 μA, no voltage is applied to the gate, and thus MOSFET 1 does not operate. On the other hand, if the leak current is not more than 1 nA, it can be said that the leak current is at a level causing no problem for the operation of MOSFET 1. That is, an upper limit line 112 of the leak current is at 1 μA, and a more preferable upper limit line 113 of the leak current is at 1 nA. It is noted that the distance between the source and the gate is 1 μm.

Figure 36:
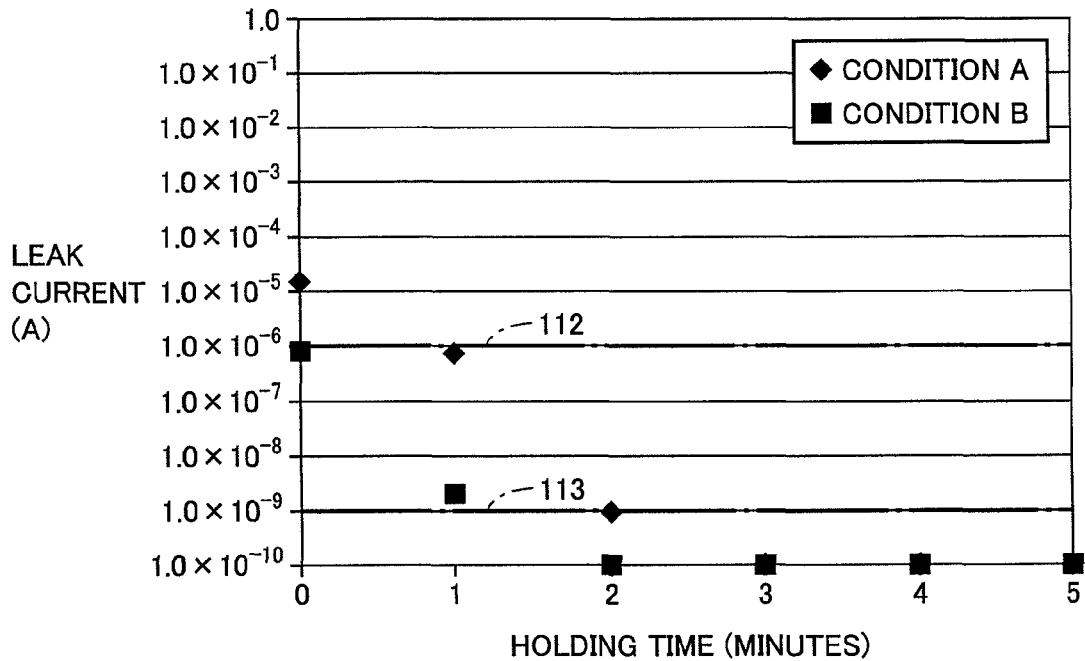
FIG. 36 is a view showing the relation between leak current and holding time.

Referring to FIG. 36, dependence of the leak current on the holding time will be described. Under conditions of a holding time of 0 minutes, 1 minute, and 2 minutes, the leak current generated when using the metal film under condition A was larger than the leak current generated when using the metal film under condition B. This is considered to be because metal film 50 under condition A contained Al more than metal film 50 under condition B. For metal film 50 under condition B, the leak current at a holding time of 0 to 1 minute was lower than upper limit line 112, and the leak current at a holding time of not less than 2 minutes was lower than more preferable upper limit line 113. For metal film 50 under condition A, the leak current at a holding time of 1 minute was lower than upper limit line 112, and the leak current at a holding time of not less than 2 minutes was lower than more preferable upper limit line 113.

Figure 37:
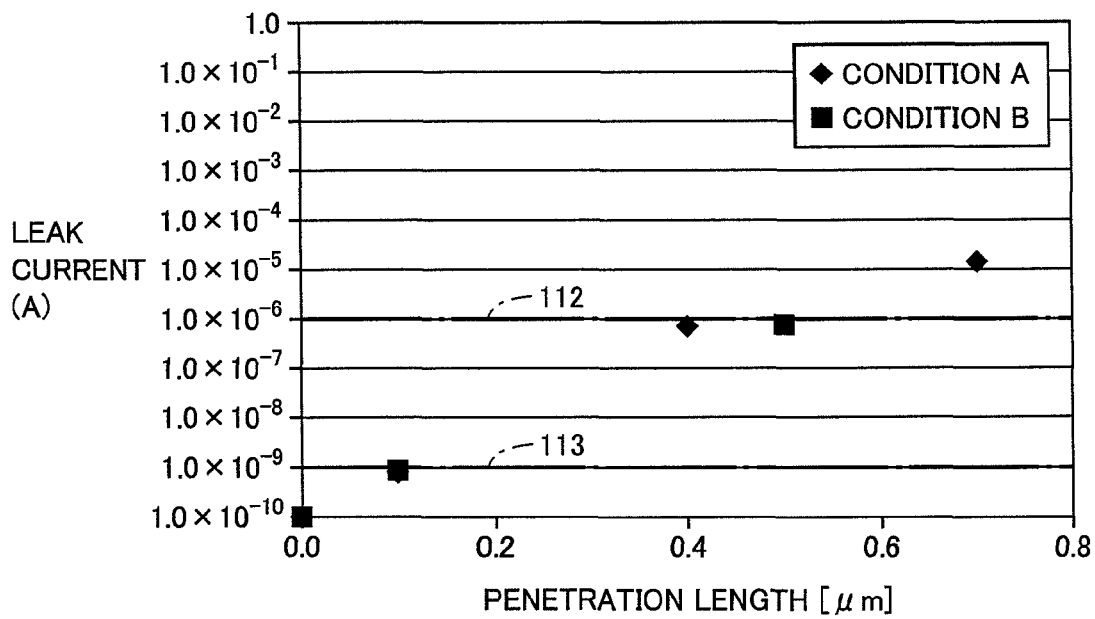
FIG. 37 is a view showing the relation between leak current and penetration length.

After measuring leak current characteristics, a cross section between the source electrode and the gate electrode of MOSFET 1 was observed using a SEM (Scanning Electron Microscope) and EDX (Energy Dispersive X-ray Spectrometry), and a range in which Al was detected was determined as a penetration length. It was confirmed that there is a correlation between the leak current and the penetration length, as shown in FIG. 37. According to this data, when the penetration length was 0.5 μm, the leak current was 1 μA, and when the penetration length was 0.1 μm, the leak current was 1 nA. In other words, it was confirmed that, in order to achieve a leak current of not more than 1 μA indicated by upper limit line 112 of the leak current, it is only necessary to set the penetration length to not more than 0.5 mm, and in order to achieve a leak current of not more than 1 nA indicated by more preferable upper limit line 113 of the leak current, it is only necessary to set the penetration length to not more than 0.1 μm.

Example 2

In the present example, preferable holding time and holding temperature for a metal film were investigated by changing the holding time and holding temperature for the metal film. First, MOSFET 1 was fabricated by the same manufacturing method as the method described in Example 1. Temperature for holding metal film 50 (holding temperature) and time for holding metal film 50 at the holding temperature (holding time) in the step of heating metal film 50 were changed. The holding temperature was set to 200° C., 300° C., 400° C., 450° C., and 500° C. For each holding temperature, the holding time was set to 1 minute, 2 minutes, 3 minutes, 4 minutes, and 5 minutes. Thereafter, metal film 50 was heated to 1000° C.

Referring to Table 1, the relation of the holding temperature and holding time for metal film 50 to leak current, n type contact resistance, and p type contact resistance will be described. It is noted that, concerning the leak current in Table 1 and Table 2 described later, mark "B" indicates that the leak current is larger than 1 μA, mark "A" indicates that the leak current is not more than 1 μA and larger than 1 nA, and mark "S" indicates that the leak current is not more than 1 nA. Further, concerning the n type contact resistance, mark "A" indicates that the contact resistivity is lower than $5 \times 10^{-5}$ Ωcm$^2$, and mark "B" indicates that the contact resistivity is not less than $5 \times 10^{-5}$ Ωcm$^2$. Furthermore, concerning the p type contact resistance, mark "A" indicates that the contact resistivity is lower than $1 \times 10^{-2}$ Ωcm$^2$, and mark "B" indicates that the contact resistivity is not less than $1 \times 10^{-2}$ Ωcm$^2$.

As shown in Table 1, at a holding temperature of 200° C., since Al does not react with Si or Ti, Al penetrated into a silicon dioxide film, and the leak current exceeded an upper limit value. Further, at a holding temperature of 500° C., when the holding time was 1 minute, the leak current was not more than the upper limit value. However, when the holding time was not less than 2 minutes, the leak current became larger than the upper limit value. At a holding temperature of not less than 300° C. and not more than 450° C., the leak current was not more than the upper limit value, irrespective of the holding time. Based on the above results, it was confirmed that the holding temperature is preferably not less than 300° C. and not more than 450° C.

Concerning the n type contact resistance, n type contact resistivity was lower than an upper limit line ($5 \times 10^{-5}$ Ωcm$^2$) in a temperature range of not less than 300° C. and not more than 450° C., at a holding time of not less than 1 minute and not more than 3 minutes. Concerning the p type contact resistance, it was confirmed that the contact resistivity was lower than $1 \times 10^{-2}$ Ωcm$^2$ in the ranges of the holding temperature and holding time measured this time.

Based on the above results, it is preferable from the viewpoint of the leak current that the holding temperature for metal film 50 is not less than 300° C. and not more than 450° C. Further, when the holding temperature for metal film 50 is in the temperature range of not less than 300° C. and not more than 450° C., if the holding time for metal film 50 is not less than 2 minutes, the leak current becomes not more than 1 nA, which is preferable. In addition, it is preferable from the viewpoint of the n type contact resistance that, when the holding temperature for metal film 50 is in the temperature range of not less than 300° C. and not more than 450° C., the holding time for metal film 50 is not less than 1 minute and not more than 3 minutes. Taking both the leak current and n type contact resistance into consideration, when the holding temperature for metal film 50 is in the temperature range of not less than 300° C. and not more than 450° C., the holding time for metal film 50 is preferably not less than 2 minutes and not more than 3 minutes.

TABLE 1

| Holding temperature | 200° C. | | | | | 300° C. | | | | | 400° C. | | | | | 450° C. | | | | | 500° C. | | | | |
|---|---|---|---|---|---|---|---|---|---|---|---|---|---|---|---|---|---|---|---|---|---|---|---|---|---|
| Holding time (minutes) | 1 | 2 | 3 | 4 | 5 | 1 | 2 | 3 | 4 | 5 | 1 | 2 | 3 | 4 | 5 | 1 | 2 | 3 | 4 | 5 | 1 | 2 | 3 | 4 | 5 |
| Leak current | B | B | B | B | B | A | S | S | S | S | A | S | S | S | S | S | S | S | S | S | A | B | B | B | B |
| N type contact resistance | A | A | A | A | A | A | A | A | B | B | A | A | A | B | B | A | A | A | B | B | A | B | B | B | B |
| P type contact resistance | A | A | A | A | A | A | A | A | A | A | A | A | A | A | A | A | A | A | A | A | A | A | A | A | A |
| Usable time | not usable | | | | | 1 to 3 minutes | | | | | 1 to 3 minutes | | | | | 1 to 3 minutes | | | | | 1 minute | | | | |

TABLE 2

| Holding temperature | 200° C. | | | | | 300° C. | | | | | 400° C. | | | | | 450° C. | | | | | 500° C. | | | | |
|---|---|---|---|---|---|---|---|---|---|---|---|---|---|---|---|---|---|---|---|---|---|---|---|---|---|
| Holding time (minutes) | 1 | 2 | 3 | 4 | 5 | 1 | 2 | 3 | 4 | 5 | 1 | 2 | 3 | 4 | 5 | 1 | 2 | 3 | 4 | 5 | 1 | 2 | 3 | 4 | 5 |
| Leak current | B | B | B | B | B | S | S | S | S | S | S | S | S | S | S | S | S | S | S | S | A | B | B | B | B |
| N type contact resistance | A | A | A | A | A | A | A | A | B | B | A | A | A | B | B | A | A | A | B | B | A | B | B | B | B |
| P type contact resistance | B | B | B | B | B | A | A | A | A | A | A | A | A | A | A | A | A | A | A | A | A | A | A | A | A |
| Usable time | not usable | | | | | 1 to 3 minutes | | | | | 1 to 3 minutes | | | | | 1 to 3 minutes | | | | | 1 minute | | | | |

Next, a description will be given of the result of taking metal film 50 out of an annealing furnace after holding metal film 50 at a holding temperature for a holding time and before heating metal film 50 to 1000° C., and performing etching on metal film 50 with a slightly alkaline solution such as a TMAH solution, an acidic solution such as phosphoric acid, acetic acid, and nitric acid, or a mixed solution thereof. Table 1 shows results obtained when the etching was not performed, and Table 2 shows results obtained when the etching was performed.

As shown in Table 2, under conditions of a holding time of 1 minute at a holding temperature of 300° C. and a holding time of 1 minute at a holding temperature of 400° C., the leak current became not more than 1 nA. That is, it was possible to further reduce the leak current by performing etching. This is considered to be because unreacted Al was removed by etching and thus Al penetrating into the silicon dioxide film was able to be reduced.

Based on the above results, it was confirmed that the leak current can be reduced by holding metal film 50 at a temperature of not less than 300° C. and not more than 450° C., and thereafter performing wet etching to remove Al.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device, comprising the steps of:
    preparing a silicon carbide substrate;
    forming a silicon dioxide film on said silicon carbide substrate; and
    forming an electrode containing Al and Ti to make contact with said silicon carbide substrate and said silicon dioxide film,
    the step of forming said electrode including the steps of
        forming a metal film containing Al and Ti on said silicon carbide substrate, and
        heating said metal film,
    the step of heating said metal film having the steps of
        increasing temperature of said metal film from a temperature of less than 300° C. to a temperature of not less than 300° C. and not more than 450° C. with a first temperature gradient,
        holding said metal film within a temperature range of not less than 300° C. and not more than 450° C. with a second temperature gradient, after the step of increasing the temperature of said metal film, and
        increasing the temperature of said metal film to a temperature of not less than 500° C. with a third temperature gradient, after the step of holding said metal film,
    said second temperature gradient being smaller than said first temperature gradient and said third temperature gradient.

2. The method for manufacturing the silicon carbide semiconductor device according to claim 1, wherein said metal film further contains Si.

3. The method for manufacturing the silicon carbide semiconductor device according to claim 1, wherein, in the step of increasing the temperature of said metal film to a temperature of not less than 500° C., the temperature of said metal film is increased to a temperature of not less than 700° C.

4. The method for manufacturing the silicon carbide semiconductor device according to claim 1, wherein the step of forming said metal film has the steps of:
    forming a Ti layer to make contact with said silicon carbide substrate and said silicon dioxide film;
    forming an Al layer on said Ti layer; and
    forming a Si layer on said Al layer.

5. The method for manufacturing the silicon carbide semiconductor device according to claim 1, wherein
    the step of heating said metal film further has the step of removing Al by performing wet etching on said metal film, and
    the step of removing said Al is performed after the step of holding said metal film within the temperature range of not less than 300° C. and not more than 450° C. and before the step of increasing the temperature of said metal film to a temperature of not less than 500° C.

* * * * *